(12) United States Patent
Matsuda et al.

(10) Patent No.: US 7,486,140 B2
(45) Date of Patent: Feb. 3, 2009

(54) DIFFERENTIAL AMPLIFIER

(75) Inventors: Akiyoshi Matsuda, Kasugai (JP);
Tsunehiko Moriuchi, Kasugai (JP);
Hiroko Haraguchi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 62 days.

(21) Appl. No.: 11/315,190

(22) Filed: Dec. 23, 2005

(65) Prior Publication Data
US 2006/0139098 A1 Jun. 29, 2006

Related U.S. Application Data

(63) Continuation-in-part of application No. 11/094,362, filed on Mar. 31, 2005, now abandoned, which is a continuation-in-part of application No. 10/943,975, filed on Sep. 20, 2004, now abandoned.

(30) Foreign Application Priority Data

| Apr. 2, 2004 | (JP) | 2004-110204 |
| Jan. 31, 2005 | (JP) | 2005-023986 |
| Jul. 7, 2005 | (JP) | 2005-198638 |

(51) Int. Cl.
*H03F 3/45* (2006.01)
(52) U.S. Cl. .................... 330/257; 330/253
(58) Field of Classification Search ............... 330/259, 330/253, 261, 258, 257
See application file for complete search history.

(56) References Cited

U.S. PATENT DOCUMENTS

| 4,797,583 A | 1/1989 | Ueno et al. |
| 5,124,666 A * | 6/1992 | Liu et al. ................ 330/253 |
| 5,162,749 A | 11/1992 | Kobayashi |
| 6,980,054 B2 * | 12/2005 | Okada .................... 330/257 |
| 7,248,115 B2 * | 7/2007 | Nishimura .............. 330/253 |

FOREIGN PATENT DOCUMENTS

JP A-60-132416 7/1985

(Continued)

OTHER PUBLICATIONS

Behzad Razavi, "Design of Analog CMOS Integrated Circuits," Basic, Mar. 2003, cover page and pp. 82-83, Maruzen.

(Continued)

*Primary Examiner*—Henry K Choe
(74) *Attorney, Agent, or Firm*—Arent Fox LLP

(57) ABSTRACT

A differential amplifier of the present invention comprises transistors where to each of which one of two inputs to said differential amplifier is provided; current mirror circuits where each of which delivers one of the outputs of the differential amplifier to the load side; and cut-off prevention units where each of which is connected to the connecting point of a transistor to which a monitor current of one of the current mirror circuits flows, and one of the transistors to which the inputs are provided, and applies a current for preventing cutting off the transistor to which the monitor current flows, when the input to the transistor to which the input is provided is L.

35 Claims, 25 Drawing Sheets

FOREIGN PATENT DOCUMENTS

| | | |
|---|---|---|
| JP | A-3-154412 | 7/1991 |
| JP | 10-209844 | 8/1998 |
| JP | 11-127042 | 5/1999 |
| JP | 2001-251149 | 9/2001 |
| JP | A-2001-339259 | 12/2001 |

OTHER PUBLICATIONS

Behzad Razavi, "Design of Analog CMOS Integrated Circuits," Application, Mar. 2003, cover page and pp. 394-395, Maruzen.

JP-A-2005-023986, Notice of Rejection Grounds dated Jun. 6, 2008, English translation and Japanese language Notice.

\* cited by examiner

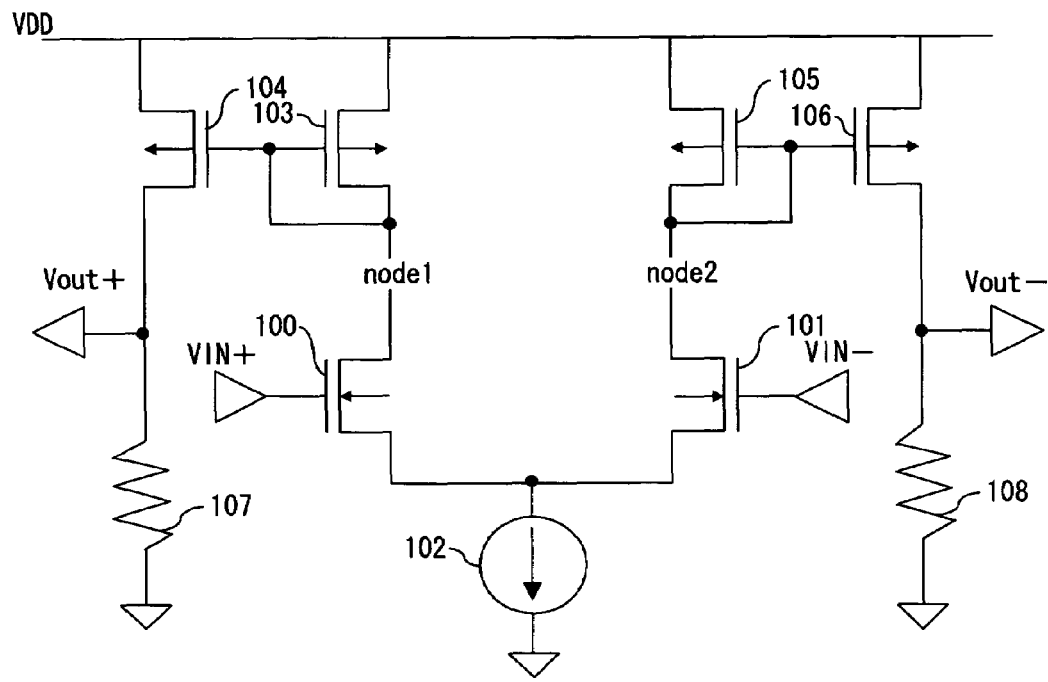
F I G. 1

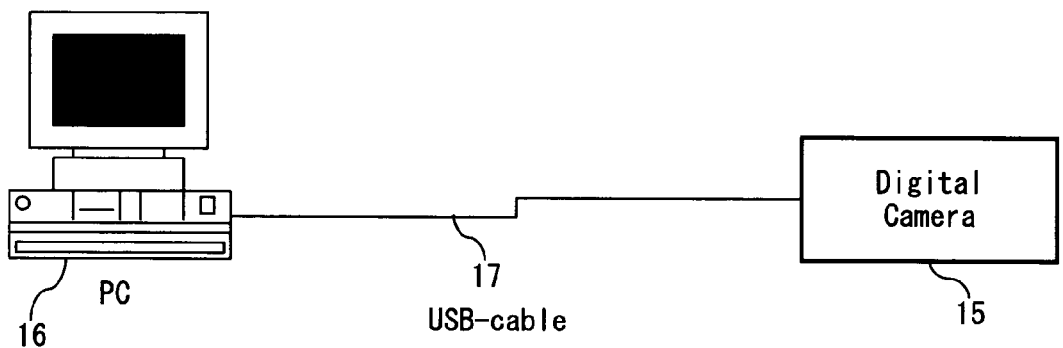
F I G. 4

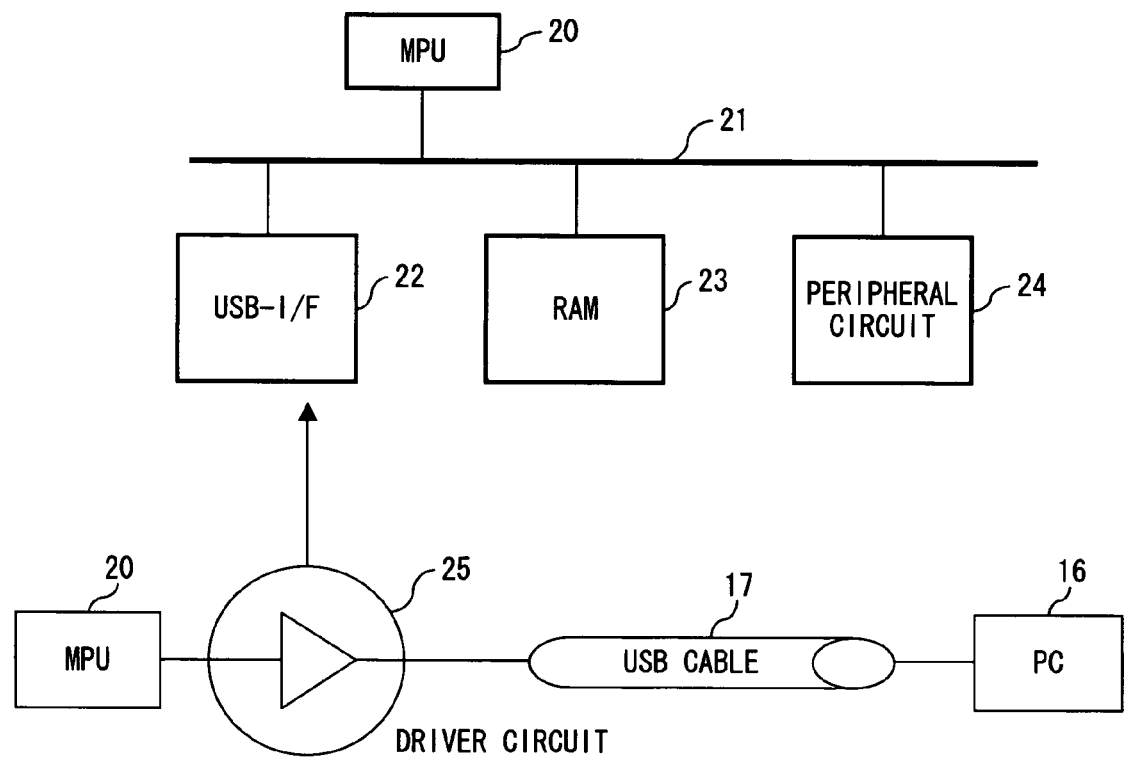
F I G. 5

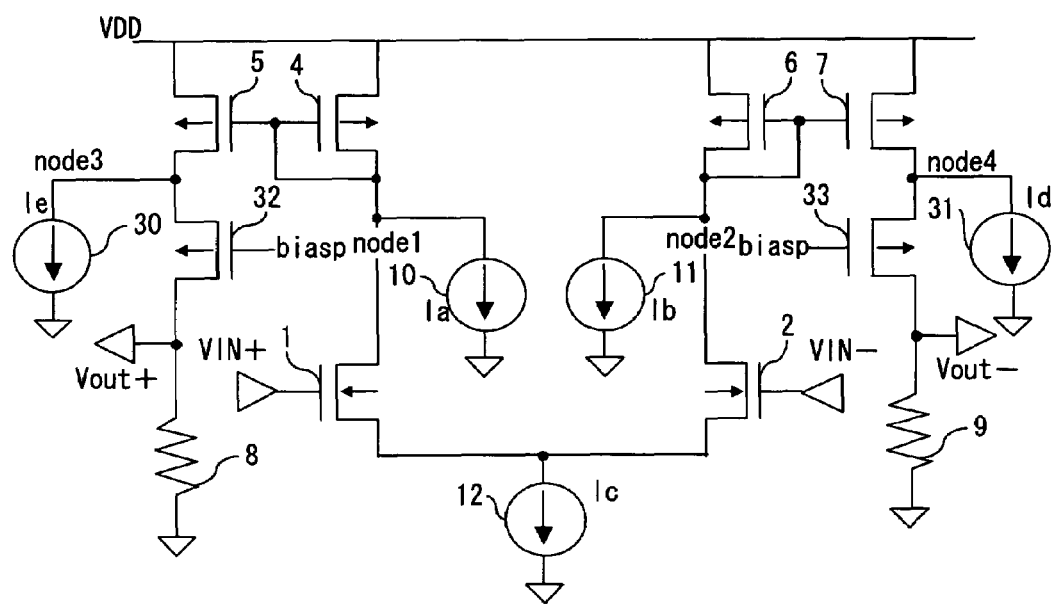
F I G. 6

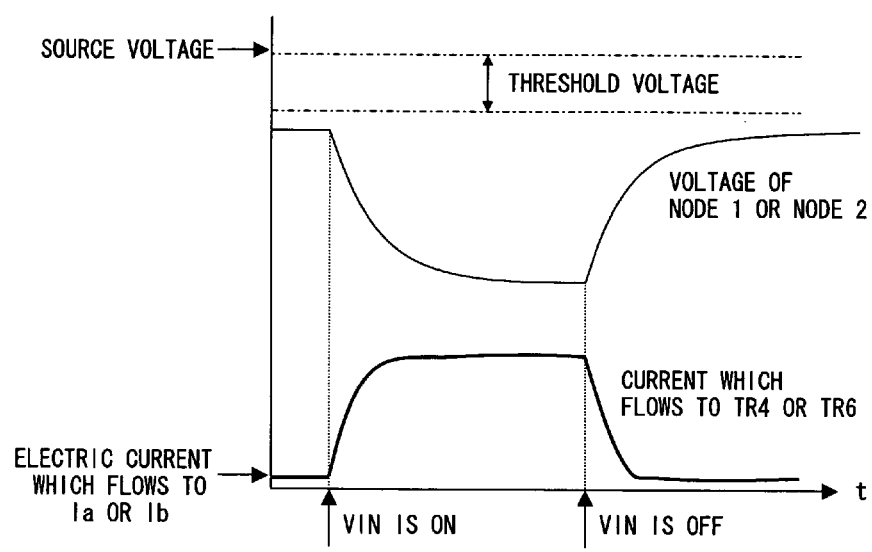
F I G. 7

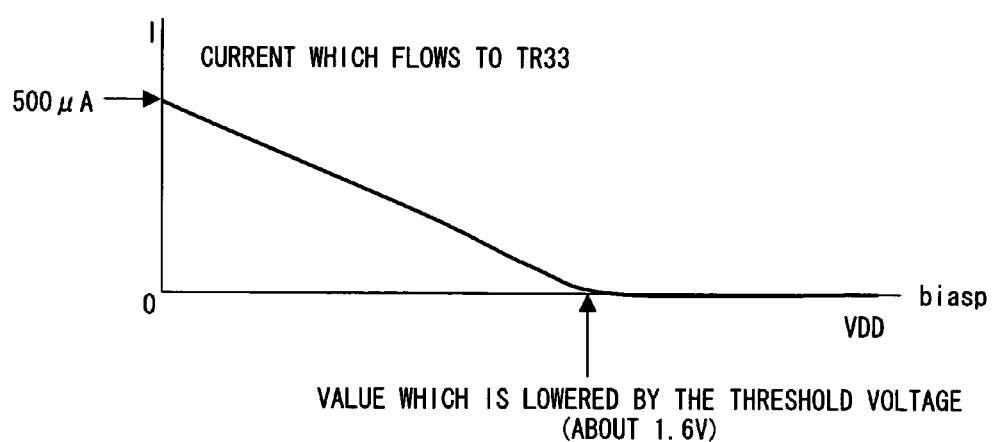
F I G. 1 2

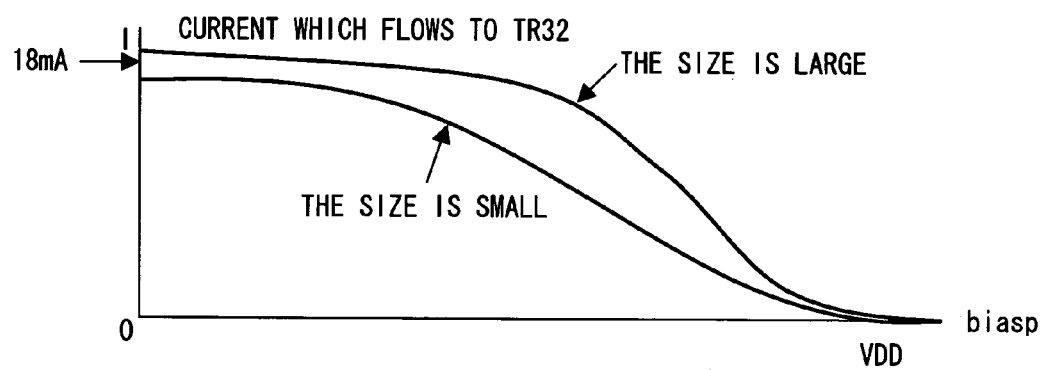
F I G. 1 3

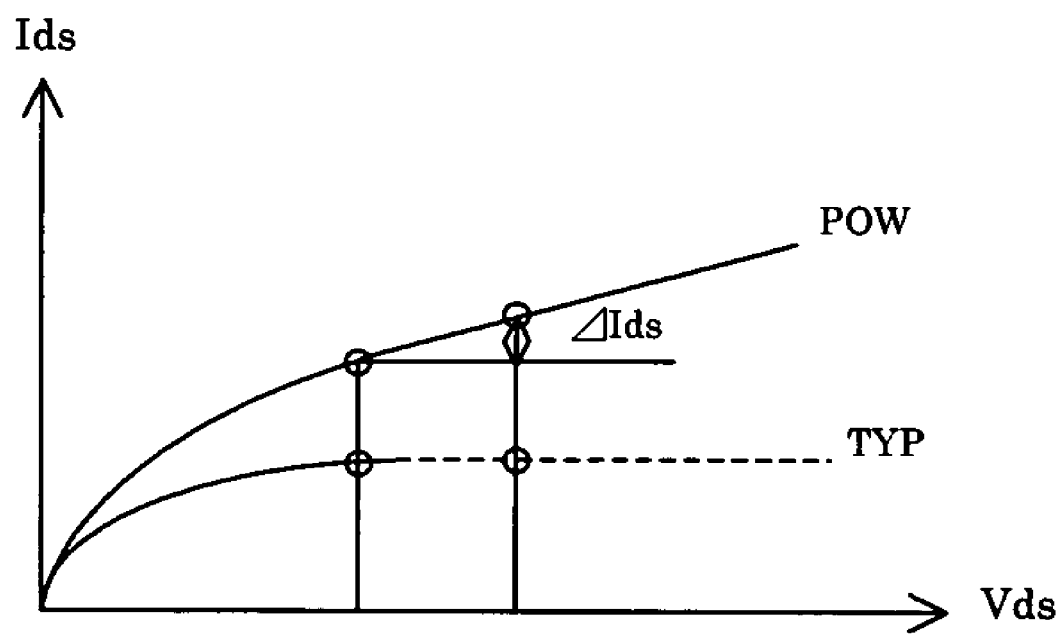
F I G. 1 7

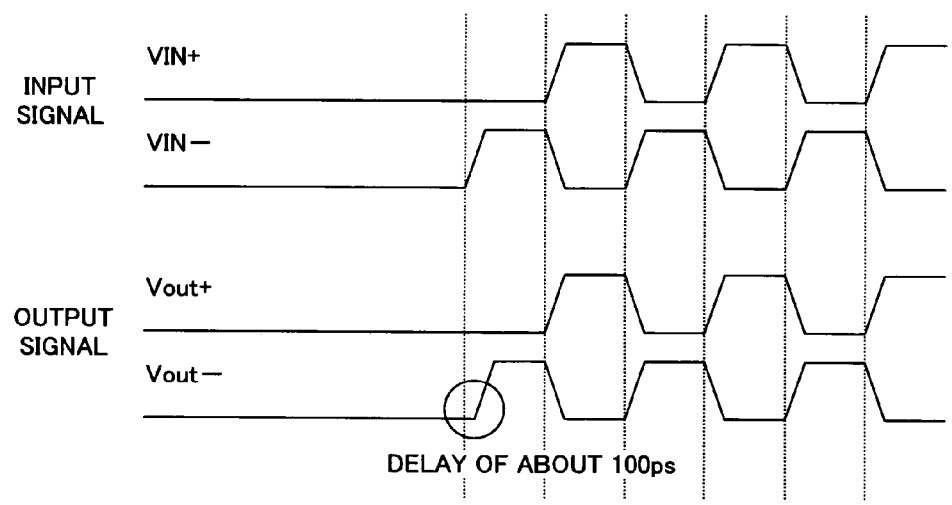
F I G. 22

DIFFERENTIAL AMPLIFIER

CROSS-REFERENCE TO RELATED APPLICATIONS

This is a continuation-in-part application of Ser. No. 11/094,362 filed on Mar. 31, 2005, now abandoned. The application Ser. No. 11/094,362 is a continuation-in-part application Ser. No. 10/943,975, filed on Sep. 20, 2004, now abandoned.

BACKGROUND OF THE INVENTION

1. Field of the Invention

The present invention relates to a semiconductor device, and more specifically to a differential amplifier having a current mirror circuit which delivers an output to the load side by an electric current, for example, a high-speed operation system of a differential amplifier used as a high-speed data transfer driver.

2. Description of the Related Art

A differential amplifier is used in a wide range of fields. FIG. 1 shows a general configuration of such a differential amplifier. This differential amplifier is a combination of a differential pair with a diode-connected load and a source follower circuit, and a current mirror circuit is constituted by said combination, and the output of the differential amplifier is delivered to the load side by an electric current.

The differential pair and source follower circuit which constitutes the differential amplifier are described in the following documents.

Non-patent document 1: "Design of Analog CMOS Integrated Circuits," Basic Edition, page 83, written by B. Razavi, translated by Tadahiro Kuroda, published by Maruzen Non-patent document 2: "Design of Analog CMOS Integrated Circuits," Applications Edition, page 394, written by B. Razavi, translated by Tadahiro Kuroda, published by Maruzen In FIG. 1, a transistor 100 and a transistor 101 to which a non-inverting input and an inverting input are supplied respectively are connected to a grounding wire by a power source 102, and are connected to a source voltage VDD by transistors 103 and 105. Diode-connected transistors 103 and 105, transistor 104, transistor 106 constitute a current mirror circuit, and the transistor 104 and the transistor 106 to which a copy electric current flows in the current mirror circuit are connected to resistors 107 and 108 on the load side respectively, and the voltage applied to the resistors 107 and 108 is taken out as an output voltage.

In FIG. 1, when either an input signal VIN+ or an input signal VIN− becomes H, the voltage of a node 1 or a node 2 begins to drop from the source voltage VDD. When the electric potential of the node 1 or the node 2 becomes lower than the value obtained by subtracting a threshold voltage from the source voltage, an electric current begins to flow to the transistor 103 and the transistor 105, and this electric current flows to the side of the output resistor by the current mirror circuit, and an output voltage is generated.

However, in the circuit shown in FIG. 1, a delay time exists from the time when an input signal is on, or H to the time when an electric current flows to the transistor 103 or 105. FIG. 2 is an explanatory drawing of this delay time. In FIG. 2, when an input signal is on, or H, the voltage of the node 1 or the node 2 begins to drop, but an electric current does not flow to the transistor 103 or the transistor 105 until the value of the voltage becomes equal to or lower than the value obtained by subtracting the threshold voltage from the source voltage. Consequently, the time when the rising of the electric current on the copy side of the current mirror starts, i.e. the time when the rising of the current which flows to the transistor 104 or the transistor 106, starts is accordingly delayed, and the output voltage delayed by the same amount.

When a differential amplifier is used as a driver circuit for high-speed data transfer, this delay time becomes a serious problem. Particularly, in order to realize the transfer speed of 480 Mbps as set forth in the USB (Universal Serial Bus) 2.0 Standard, a delay time of 100 ps or so becomes a problem. Furthermore, in order to satisfy the stress test standard of USB 2.0, there is a problem in that it is difficult to use a low withholding voltage and high-speed transistor, and it is necessary to make a large electric current flow, so the size of the transistor becomes large, and the load capacity becomes large, and the delay time also becomes long.

The following documents are available as prior art concerning such a differential amplifier.

Patent document 1: Kokai (Jpn. unexamined patent publication) No. 10-209844 "Small level signal input interface circuit"

Patent document 2: Kokai (Jpn. unexamined patent publication) No. 11-127042 "Differential amplifier"

Patent document 3: Kokai (Jpn. unexamined patent publication) No. 2001-251149 "Amplifier Circuit"

Disclosed in patent document 1 is an interface circuit which improves the operation speed in an ordinary operation mode other than the IDDQ test mode which is a test method of a semiconductor integrated circuit, which reduces the number of clocked inverters in order to reduce the circuit area, and which improves the performance.

Disclosed in patent document 2 is a differential amplifier which can reduce an average consumption of electric current within a range of the whole current input by making the output electric current variable according to the level of a non-inverting input voltage.

Disclosed in patent document 3 is an amplifier circuit which has a stable mutual conductance, is not influenced by changes in surrounding temperatures or variations in process conditions during manufacturing, and can maintain stable amplification ratios and output resistance.

However, the aforesaid prior art could not solve the problem in that in a differential amplifier having a current mirror circuit shown in FIG. 1, the transistor constituting the current mirror circuit is cut off when the corresponding input voltage is L, and a delay arises in the operation.

Furthermore, there was a problem in that delay arises in the operation when, for example, a semiconductor device including a differential amplifier is implemented for USB standard data transfer, and data transfer is started when both of two input signals, VIN+ and VIN−, to the differential amplifier are in an L state.

SUMMARY OF THE INVENTION

In light of the foregoing problems, a first purpose of the present invention is to realize an increase of the operation speed of a differential amplifier by preventing the transistors constituting a current mirror circuit from being cut off even when the corresponding input voltage is L.

A second purpose of the present invention is to realize an increase in the operation speed of a differential amplifier by preventing the transistors constituting a current mirror circuit from being cut off even when the corresponding input voltage is L or both of the two input signals are L.

A first differential amplifier of the present invention has a current source connected between a grounding wire and the terminal which can be the output point of the differential amplifier among the terminals of each transistor which constitutes the differential amplifier and to which one of two inputs to the differential amplifier is provided.

A second differential amplifier of the present invention has a circuit element connected between the terminals which can be the output points of the differential amplifier among the terminals of each transistor which constitutes the differential amplifier and to which one of two inputs to the differential amplifier is provided.

A third differential amplifier of the present invention has a cut-off prevention means which is connected to the connecting point of the transistors, to which a monitor current of the current mirror circuit flows, to deliver the output of the differential amplifier to the load side and transistors to which one of two inputs to the differential amplifier is provided, respectively, and which supplies current which does not cut off the transistors to which the monitor current flows, even when the input to the transistors to which the input is provided is L.

A fourth differential amplifier of the present invention has two transistors, which are respectively connected to terminals which can be output points of the differential amplifier, out of the terminals of each transistor to which one of two inputs to the differential amplifier is provided, where both of them constitute the differential amplifier, where in said two transistors are turned on when the input applied to respective one of said connected transistors which has a terminal which can be the output point of said differential amplifier is L and turned off when the input is H. And further has a current source which is connected between said two transistors and the grounding wires.

A fifth differential amplifier of the present invention has transistors both of which together constitutes said differential amplifier and to each of which one of two inputs to said differential amplifier is provided, respectively, current mirror circuits each of which delivers one of the outputs of the differential amplifier to the load side, and cut-off prevention units each of which is connected to the connecting point of a transistor to which a monitor current of one of the current mirror circuits flows and one of the transistors to which the inputs are provided, and applies a current for preventing cutting off the transistor to which the monitor current flows, only when the input to the transistor to which the input is provided is L.

BRIEF DESCRIPTION OF THE DRAWINGS

FIG. 1 shows a conventional configuration of a differential amplifier.

FIG. 4 shows an example of the image data transfer system in which the differential amplifier of the present invention is used.

FIG. 5 shows a configuration of the LSI in a digital camera shown in FIG. 4.

FIG. 6 shows a basic configuration of the differential amplifier of the present invention.

FIG. 7 shows a waveform of the current which flows to the transistors constituting the differential amplifier show in FIG. 6.

FIG. 12 is an explanatory drawing of a method of determining a bias voltage biasp.

FIG. 13 is an explanatory drawing of the method of determining the size of a transistor.

FIG. 17 shows the leakage current due to process fluctuations.

FIG. 22 is an explanatory diagram of operation delay in the differential amplifier when data transfer starts.

DESCRIPTION OF THE PREFERRED EMBODIMENTS

Described below are details of the preferred embodiments of the present invention with reference to the accompanying drawings.

Figure 2:
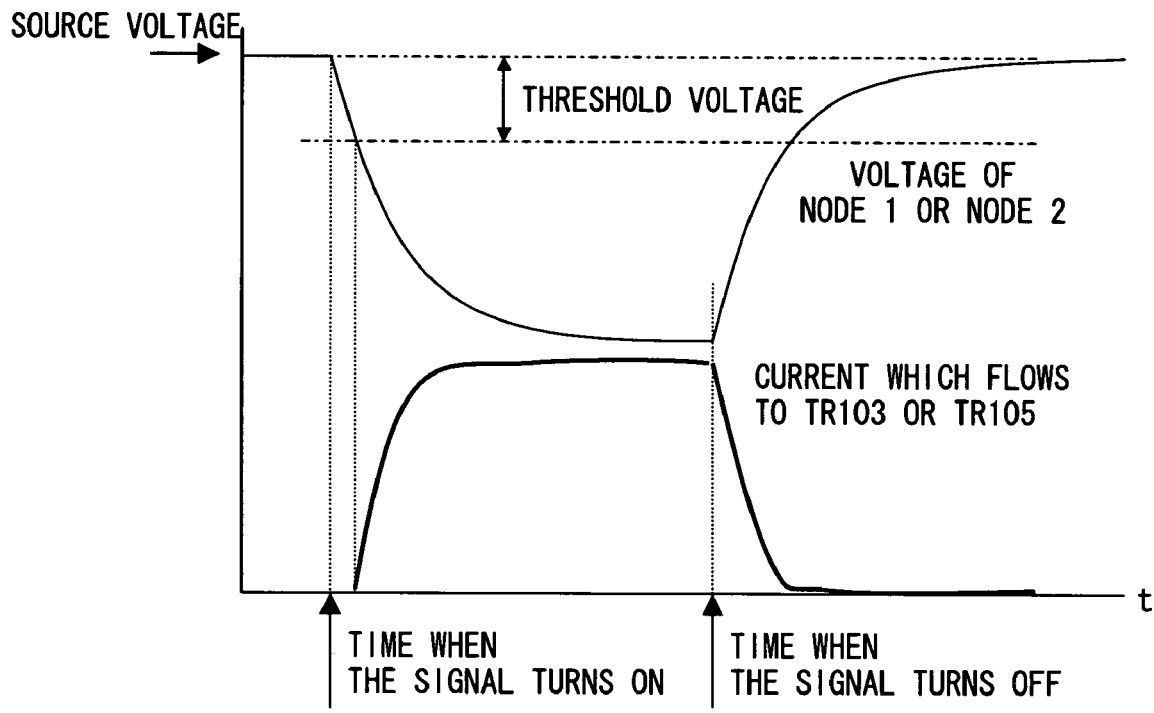
FIG. 2 shows an explanatory drawing of current delay in the conventional configuration shown in FIG. 1.
Figure 3:
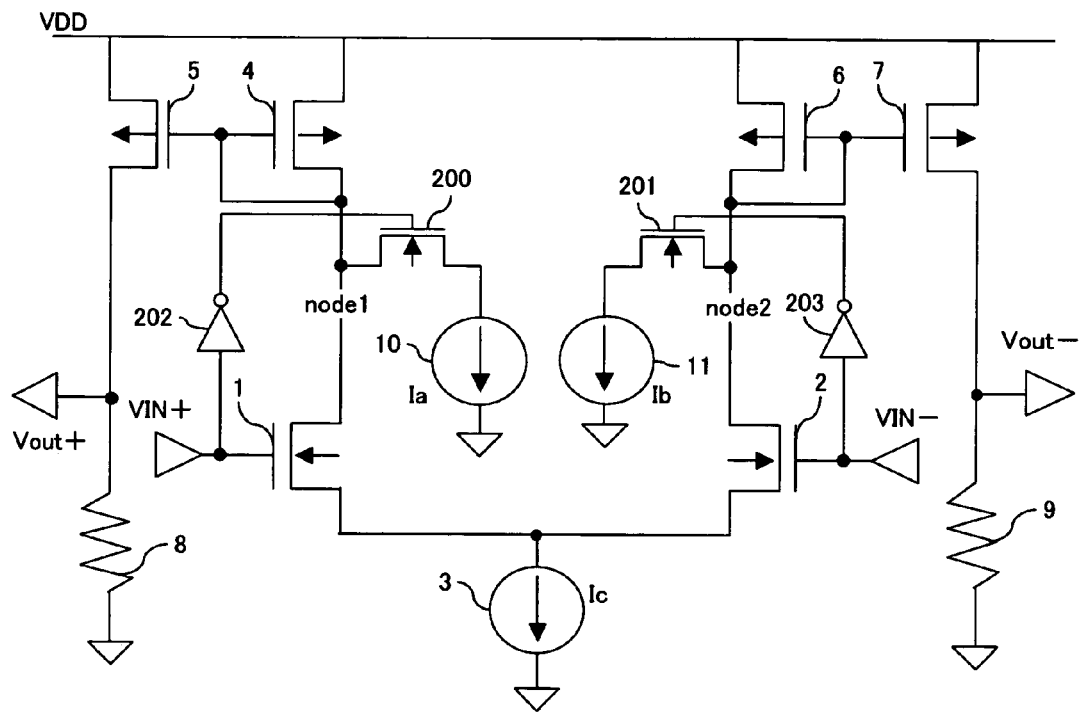
FIG. 3 shows a configuration indicating the principle configuration of the differential amplifier of the present invention.

FIG. 3 shows a configuration indicating the principle of the differential amplifier of the present invention. The same figure shows the configuration indicating the principle of the present invention in comparison with the conventional configuration shown in FIG. 1. Compared with FIG. 1, in the configuration of the differential amplifier of the present invention, a transistor 200 and a current source 10 are connected inline between a node 1 and a grounding wire, and a transistor 201 and a current source 11 are connected inline between a node 2 and a grounding wire. Here, the two transistors 200 and 201 are turned on when input voltages VIN+ and VIN−, corresponding respectively to node 1 and node 2, are L and are turned off when the input voltages are H.

In other words, the differential amplifier of the present invention is provided with two transistors, which are respectively connected to terminals which can be the output points of the differential amplifier, out of the terminals of each transistor to which one of two inputs to the differential amplifier is provided, respectively, and both of them constitute the differential amplifier, where the two transistors are turned on when the input applied to the transistor having a terminal which can be an output point of the differential amplifier is L and turned off when the input is H. The differential amplifier is also provided with a current source which is connected between these two transistors and the grounding wires. Here, the current source does not have to be separate, as in FIG. 1, but rather, one current source can be shared.

The functionally described below is the principle of the present invention. The differential amplifier of the present invention has a cut-off prevention means which is connected between the connection point of the above-recited transistor to which one of two inputs is supplied and that of the transistor to which the monitor current of the current mirror circuit flows to deliver the output of the differential amplifier to the load side and which makes the current which does not cut off the transistor to which the monitor current flows flow, only when the input, which corresponds to the transistor to which the input is provided and the current mirror circuit, is L.

The transistors 200 and 201 in FIG. 3 are both n-channel transistors, and the gates of two transistors 1 and 2, to which input signals are applied and the gates of transistor 200 and 201 are connected, respectively, to inverters 202 and 203. This is to enable the two transistors 200 and 201 to turn on when the values of input signals VIN+ and VIN– are L, and if, for example, the transistors 200 and 201 are p-channel transistors, inverters 202 and 203 become unnecessary and the gates of the transistor 1 and transistor 200 are directly connected, as are the gates of the transistor 2 and transistor 201.

As described above, in the present invention, an operation is performed, wherein electrical current is applied so that the transistors, to which the monitor current of the current mirror circuit flows, is not cut off, only when input to the connection point of the transistors to which input to the differential amplifier is applied and the current mirror circuit for passing output onto the load is L.

According to the present invention, for example, in a differential amplifier comprising a current mirror circuit for delivering output to the load side by electrical current, high-speed operation of the differential amplifier can be performed by not cutting off the transistors to which the monitor current of the current mirror circuit flows when the input voltages are L, including when the two input voltages to the differential amplifier are both L. In addition, power consumption can be reduced compared to when the input voltage is H, by enabling this current for preventing cut-off to flow only when the input voltage is L.

The differential amplifier embodying the present invention is used for a data transfer driver circuit when data transfer using, for example, a USB cable is implemented. FIG. 4 is a block diagram of a connecting system of a digital camera and a personal computer using such a USB cable. In FIG. 4, the digital camera 15 and the personal computer 16 are connected by the USB cable 17, and image data, for example, is transferred from the digital camera 15 to the personal computer 16 by the USB cable 17. This driver circuit for transferring this image data is provided inside of the digital camera 15, and the differential amplifier is used as that driver circuit.

FIG. 5 is an explanatory drawing of the LSI configuration in the digital camera shown in FIG. 4 and the data transfer method. In FIG. 5, the LSI in the digital camera comprises a microprocessor (MPU) 20 controlling the whole of the digital camera, a bus 21, a USB interface 22, random access memory 23, and a peripheral circuit 24.

A driver circuit 25 constituted by the differential amplifier embodying the present invention is a part of the USB interface 22, and transmits, for example, image data to the personal computer 16 via the USB cable 17 under the control of the MPU 20.

FIG. 6 shows the basic configuration of the differential amplifier of the present invention. When the basic configuration shown in FIG. 6 is compared with the principle configuration of the differential amplifier shown in FIG. 3, the two transistors 200 and 201 and the two inverters 202 and 203 are omitted, current source 10 is directly connected to node 1 and current source 11 is directly connected to node 2.

In other words, in FIG. 6, because current sources 10 and 11 are connected directly between nodes 1 and 2 and the grounding wires, the cutting off of the transistors 4 and 6 can be prevented regardless of the values of input voltages VIN+ and VIN– applied to the transistors 1 and 2 comprising the differential amplifier, by constantly applying a weak current to the transistors 4 and 6, through which the monitor current of the current mirror circuit flows. Therefore, high-speed operation of the differential amplifier can be performed.

As described above, in the principle configuration in FIG. 3, operation can be performed at an increased speed even at the start of, for example, a USB data transfer without cutting off the transistors 4 and 6, through which the monitor current of the current mirror circuit flows, when the input voltages are both L, by turning on the transistors 200 and 201 only when input applied respectively thereto is L. In addition, overall power consumption can be reduced by not applying a weak current to prevent this cut-off when the input applied to the transistors is H.

First, an embodiment corresponding to FIG. 6, wherein a current source is connected directly to the node 1 and node 2 or electric current is constantly applied so as not to cut off the transistor through which the monitor current of the current mirror circuit flows by connecting a circuit element or the like between the node 1 and node 2, is described in the explanation below. Embodiments corresponding directly to FIG. 3 or similar thereto are explained as the eighth to tenth embodiments, described hereafter.

FIG. 6, is found to differ in that transistors 32 and 33 are connected to the transistors 5 and 7 respectively, in which the current copied in the current mirror circuit shown in FIG. 3 flows and the resistors 8 and 9; and that Ie30 is connected to the connection point of the transistor 5 and the transistor 32, i.e., a node 3, and that a current source Id31 is connected at the connection point of the transistor 7 and the transistor 33, i.e., a node 4. Resistors 8 and 9 play the role of terminal resistors on the data transfer side in the driver circuit shown in FIG. 6. The transistor 5 or 7 shown in FIG. 6 corresponds to the first transistor in claim 3 of the present invention, and the transistor 32 or 33 corresponds to the second transistor.

In the principle configuration principle shown in FIG. 3, a weak current is made to always flow to the transistor 4 and the transistor 6 even when the input is L by connecting current sources Ia10 and Ib11 to the node 1 and the node 2, respectively and so that these transistors will not be cut off. However, since this weak current is flowing to the transistor 4 or the transistor 6, an electric current also flows to the transistors to which the current copied in the current mirror circuit flows, i.e., the transistor 5 and the transistor 7, thus causing an output voltage to be generated.

Thereupon, an electric current which flows to the transistor 5 and the transistor 7 is made to flow to the side of the current source by connecting current sources Ie30 and Id31 to a node 3 and a node 4 respectively, and not to flow to the terminal resistor 8 or 9, as shown in the basic configuration shown in FIG. 6. Even though an electric current is made to flow to the side of the current source, the voltage of the node 3 and the node 4 do not become 0 completely, an output voltage is generated. The output voltage can be made 0 by inserting transistors 32 and 33 and turning these transistors off in the state in which the input of the gate voltage bisap is L, that is, adjusting the gate voltage so that the electric potential drops from the electric potential of the node 3 or the node 4 by that of the threshold voltage. Then, in the state in which the input voltage becomes H, and a comparatively large current flows to the transistor 5 or the transistor 6, the electric potential of the node 3 and the node 4 rises, and Vgs in a transistor 32 or a transistor 33 becomes large, and an electric current flows to the terminal resistor 8 or 9.

FIG. 7 shows the change of an electric current, for example, in the basic configuration shown in FIG. 6. Before an input voltage VIN turns on, the transistor 4 or the transistor 6 is not cut off even if the current which flows to the current source Ia10 or Ib11 is weak. When VIN signal turns on, the voltage of the node 1 or the node 2 drops, and the current which flows to the transistor 4 or the transistor 6 increases. The voltage of the node 1 or the node 2 is kept lower than the source voltage by a value which is equal to or higher than a threshold voltage.

Figure 8:
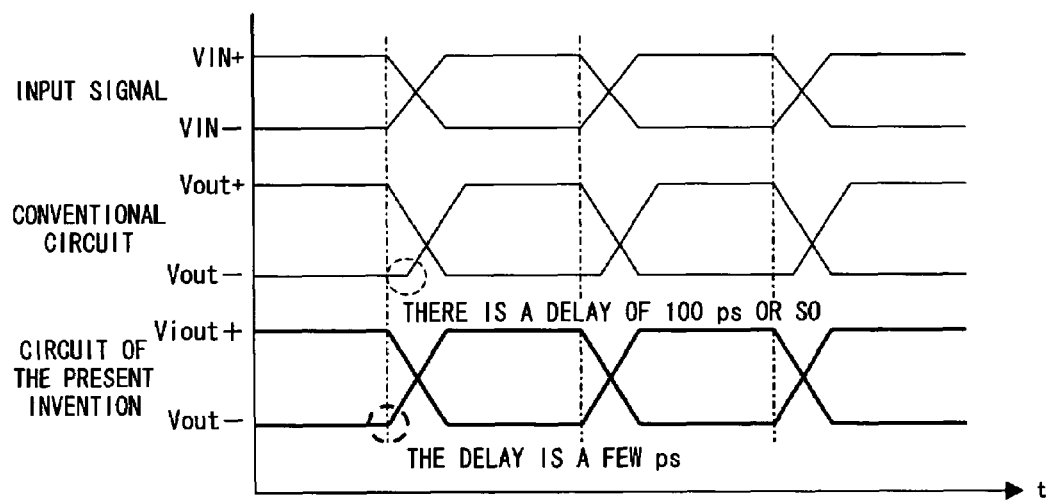
FIG. 8 is a time chart showing the relationship between an input signal and an output signal in the differential amplifier of the present invention.

FIG. 8 is a time chart of an input signal and an output signal which correspond to the basic circuit shown in FIG. 6. Compared with the uppermost input signal shown in FIG. 8, a delay of 100 ps or so arises from the time when an input signal begins to boot up to the time when an output signal begins to boot up in the conventional circuit as shown in FIG. 1. In the circuit of the present invention, the delay is only a few ps, so that problems such as lags of a cross point and differences of duty ratio, etc., as in the conventional circuit can be solved.

Figure 9:
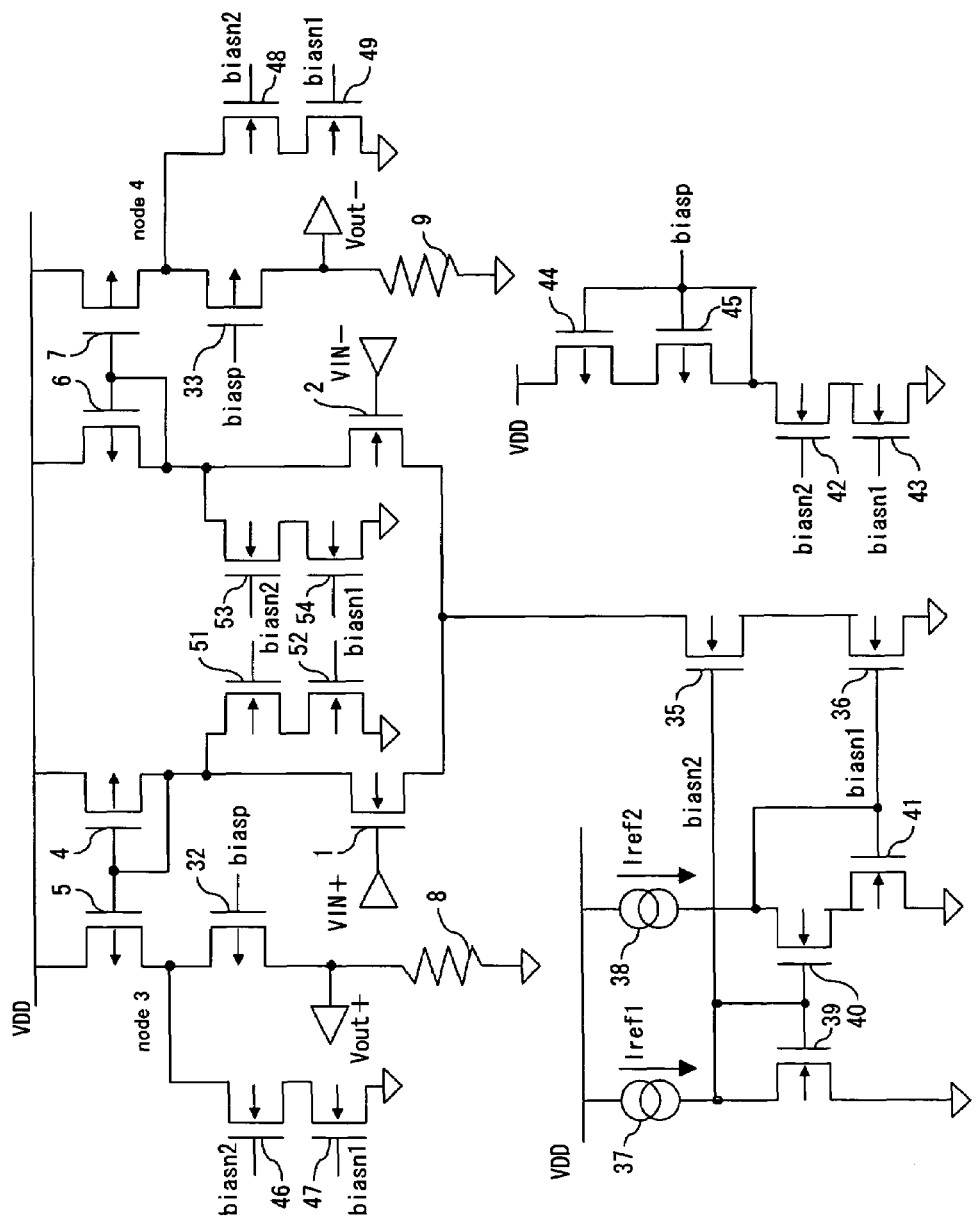
FIG. 9 shows a configuration of a first embodiment of the differential amplifier.

FIG. 9 shows the configuration of the first embodiment of the differential amplifier of the present invention. In this first embodiment, in which a mutual conductance and output resistor as basic physical parameters of a MOSFET can be easily represented using a current I, a current bias circuit is used as a bias circuit, and in order to mirror the current accurately in the current mirror circuit, the bias circuit is configured as a cascade type, and a low-voltage current mirror circuit which can decrease the lowest limit of the output voltage of the current source circuit is used.

This low-voltage current mirror circuit comprises two reference current sources 37 and 38 which determine bias voltages biasn1 and biasn2, three transistors 39, 40 and 41, and these bias voltages are applied to the gates of two transistors 35 and 36, and the current source Ic12 shown in FIG. 6 is constituted as a whole.

The four current sources shown in FIG. 6 comprises two transistors in which two bias voltages are applied to the gates respectively. The current source Ia10 comprises transistors 51 and 52; the current source Ib11 comprises transistors 53 and 54, the current source Ie30 comprises transistors 46 and 47; and the current source Id 31 comprise transistors 48 and 49.

The bias voltage biasp which is applied to the gates of the transistor 32 and the transistor 33 is determined so that the transistor 32 or the transistor 33 turns off when the input voltage is L by connecting the transistor 42 and the transistor 43 in which two bias voltages biasn1 and biasn2 are applied to the gates respectively, as shown in the right bottom of FIG. 9, and further by using two transistors 44 and 45 in the path to the VDD. This determination will be further described later.

Figure 10:
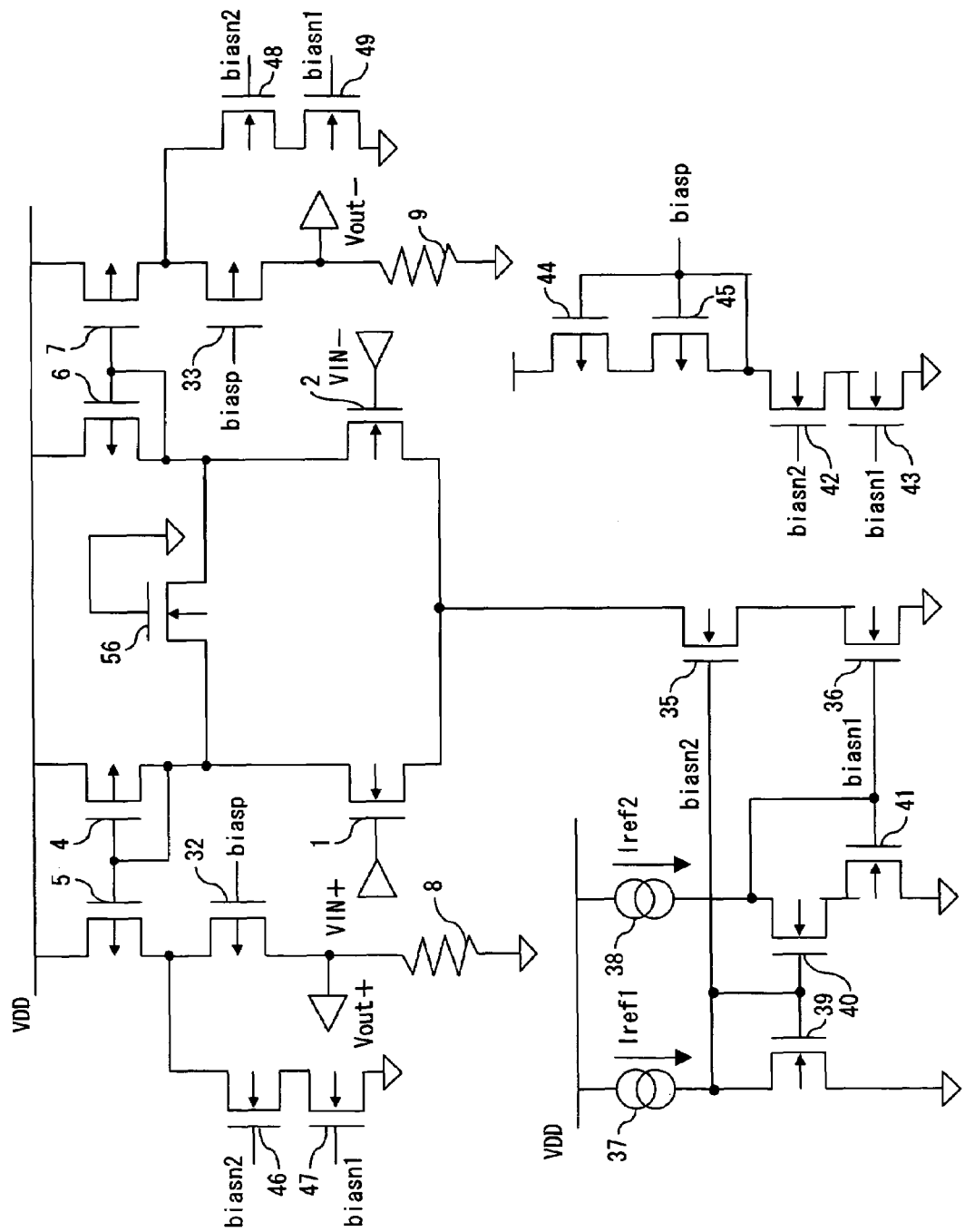
FIG. 10 shows the configuration of a second embodiment of the differential amplifier.

FIG. 10 shows the configuration of the second embodiment of the differential amplifier. When the configuration of FIG. 10 is compared with the configuration of the first embodiment shown in FIG. 9, it is found to be different in that a transistor 56 which connects the two output points of the differential amplifier is provided in place of transistors 51 and 52 and the transistors 53 and 54 which constitute two current sources Ia10 and Ib11 respectively as shown in FIG. 9. In FIG. 10, for example, when input voltage VIN+ to the gate of the transistor 1 is H, a weak current flows to the transistor 6 via the transistor 56. Consequently, the transistor 6 which was cut off in the conventional circuit is not cut off, and a high-speed response can be possible in the same way as in the first embodiment shown in FIG. 9. This transistor 56 can be an element which can make a weak current flow, and it can be substituted by, for example, a resistor.

Figure 11:
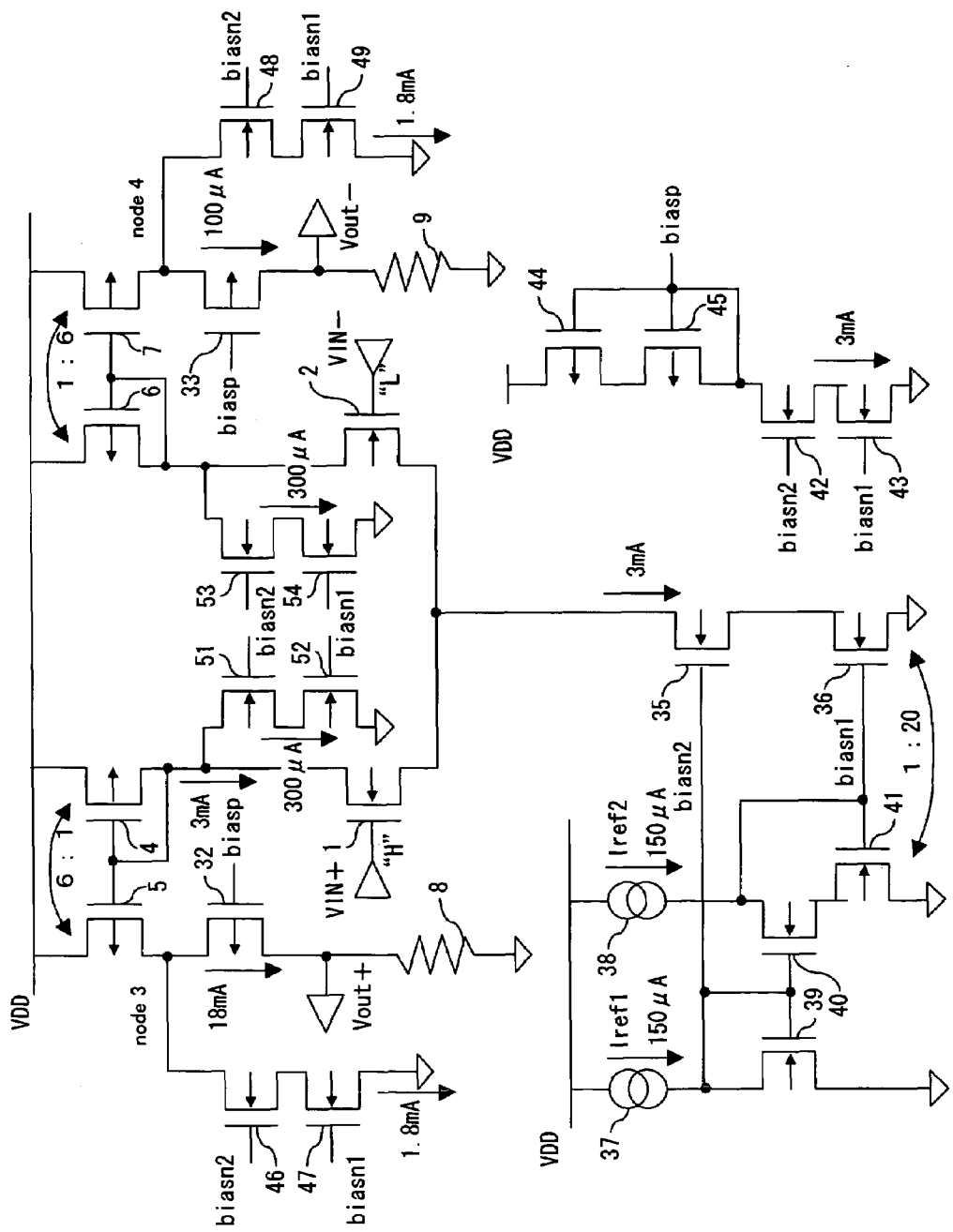
FIG. 11 explains an example of a current value when a bias voltage is determined in the first and the second embodiments.

Further described below is the determination of a bias voltage in these two embodiments with reference to FIGS. 11 to 13. FIG. 11 shows an explanatory drawing of with specific current values in the circuit when the bias voltage biasp is determined in the first embodiment shown in FIG. 9. In the first embodiment shown in FIG. 9, for example, the value of the bias voltage biasp is determined by adjusting the size of the two-stage connected p-channel transistors 44 and 45 and the current which flows therein. FIG. 11 is an explanatory drawing of this adjustment and the current values and voltage values when the transistor size of the transistors 32 and 33 in which the bias voltage is applied to the gates is determined.

If the current which flows to the transistor 6 is set to 300 μA when the input voltage VIN− to the gate of the transistor 2 is L, the current of 1.8 mA which is six times as much as 300 μA flows to the transistor 7 in accordance with the size ratio of the transistor in the current mirror circuit. This current basically flows towards the current source Id, i.e., the transistors 48 and 49.

At that time, if the electric potential of the connection point of the transistors 7 and 33, i.e. the position of the node 4 is set to 2.2 V, an electric current begins to flow to the transistor 33 when the electric potential of biasp is lowered by the value of the threshold voltage (about 0.6 V). FIG. 12 is an explanatory drawing of the relationship between this current and the value of biasp. Since it is difficult to determine the value of biasp accurately when the current of Tr33 begins to actually flow, the value of biasp provided when the current becomes 100 μA is obtained by an estimate from FIG. 12 in the preferred embodiment of the present invention.

Even if the electric potential of the connection point of the transistors 5 and 32, i.e., the node 3 is high, and the value of biasp is close to VDD, an electric current flows to the transistor 32. Then, the size of the transistor 32 is determined in such a way that a desired current (here, 18 mA) flows when the value of biasp is the estimated value, as shown in FIG. 13.

Next, described below is the determination of bias voltages biasn1 and biasn2 which are applied to the gates of two transistors, for example, 35 and 36 constituting each current source shown in FIG. 9. For example, the biasn1 applied to the gate of the transistor 36 is determined by the following expression using the size of the transistor 41, the value of a current Iref2 which flows therein, a threshold voltage Vr, and the parameter $\beta_1$ which is proportional to the channel width and channel length of the transistor 41.

$$\text{bias}n1 = V_r + \sqrt{2Iref2/\beta_1} \quad \text{[Expression 1]}$$

Next, the gate voltage biasn2 of the transistor 35 is determined by the following expression using the size of the transistor 39, the parameter $\beta_2$ and the current Iref1.

$$\text{bias}n2 = V_r + \sqrt{2Iref1/\beta_2} \quad \text{[Expression 2]}$$

In the low-voltage current mirror circuit, the value of the bias voltage biasn2 is determined by the following expression by making the values of two reference voltages equal (Iref1=Iref2) and making the size ratio of the transistor 41 and the transistor 39 4 to 1.

$$\text{bias}n2 = V_r + \sqrt{2Iref2/0.25\beta_1} = V_r + 2\sqrt{2Iref2/\beta_1} \quad \text{[Expression 3]}$$

It is explained in the first and the second embodiments shown in FIG. 9 and FIG. 10 that the accuracy of the current mirror can be improved by using a low-voltage current mirror circuit, and that the voltage value range in which a CMOS analog circuit can be used by lowering an output voltage can be expanded. However, in the differential amplifier of the present invention, various kinds of current mirror circuits can be used without being limited to such a low-voltage current mirror circuit. Details of the various kinds of low-voltage current mirror circuits including a low-voltage current mirror circuit are described in the following document.

Figure 14:
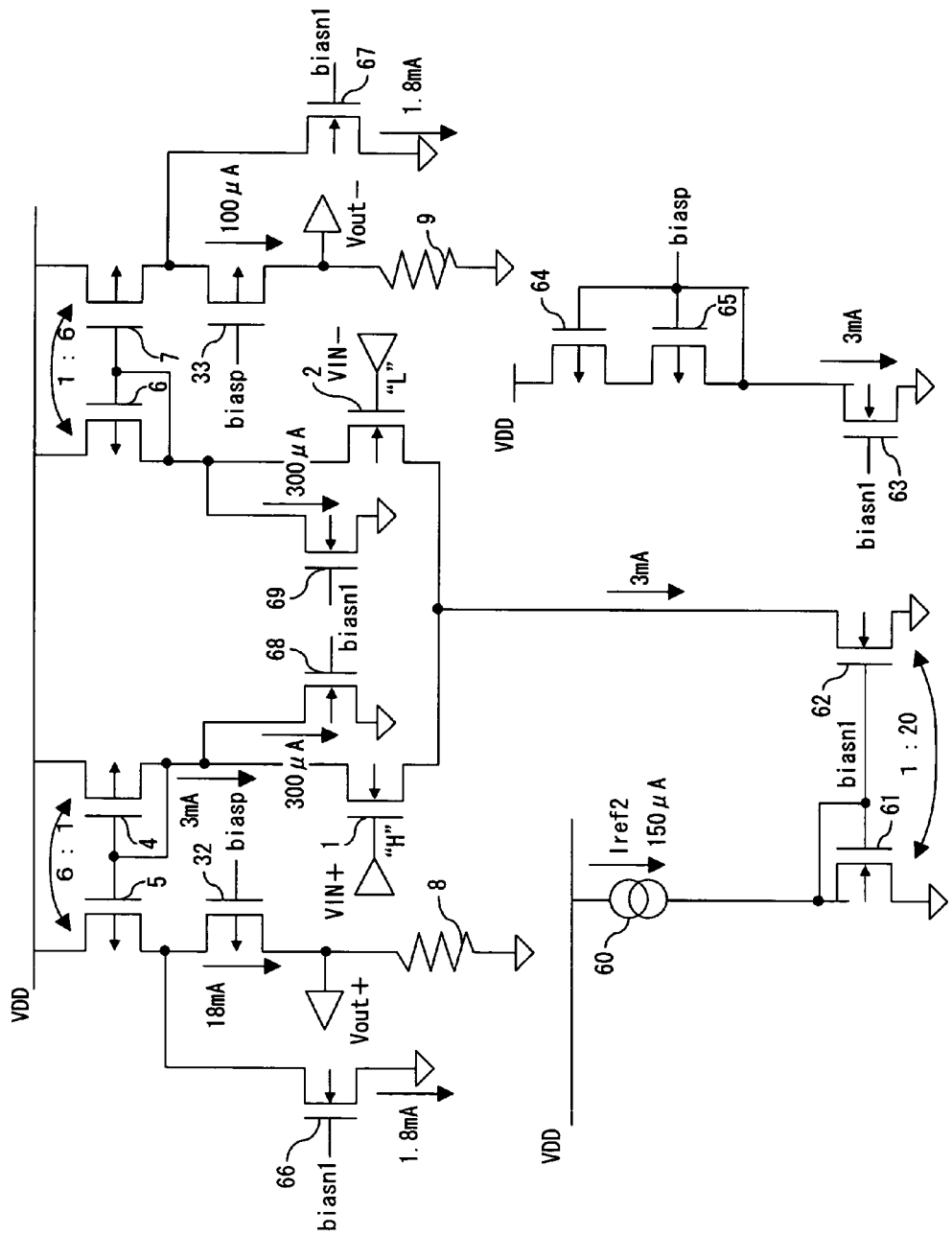
FIG. 14 shows a configuration of a third embodiment of the differential amplifier.

Non-patent document: "A Guide to CMOS Analog Circuit—Bias Circuit" in Design Wave Magazine 2002, August, Page 153, by Kenji Taniguchi FIG. 14 shows the configuration of the third embodiment of the differential amplifier using the most fundamental current mirror circuit. FIG. 14 is an example of the configuration of a differential amplifier using the fundamental current mirror circuit which comprises a reference current 60 and two transistors 61 and 62. In the third embodiment, four current sources Ia10, Ib11, Ie30 and Id31 comprise transistors 68, 69, 66 and 67 respectively. Bias voltage biasn1 is applied to the gates of these transistors from the gate of the transistor 61. Furthermore this voltage is also applied to the gate of the transistor 63, and the bias voltage biasp which is applied to the gates of two transistors 32 and 33 by the two-stage connection of p-channel transistors 64 and 65 is determined, for example, as shown in FIG. 9.

In the fundamental current mirror circuit used in the third embodiment, the accuracy of the current mirror is a little lower. In particular, when miniaturization processes advance, the inclination of characteristics of the voltage Vds between the drain and the source against the gate current Id in the saturation region becomes large. For example, even if the size ratio of the transistors 61 and 62 is set to 1 to 1, when the value Vds differs between the transistors 61 and 62, it is not possible to make the currents flowing to the transistor 61 and the transistor 62 equal.

The performance of such a current source circuit can be improved by making the output resistance of the current circuit larger. A representative method of making the output resistance larger is a cascade circuit. A current source circuit having a large output resistance can be made by forming the circuit monitoring a reference current and the circuit producing a copy current in a cascade structure, i.e., a structure in which the elements are piled up in a plurality of stages.

Figure 15:
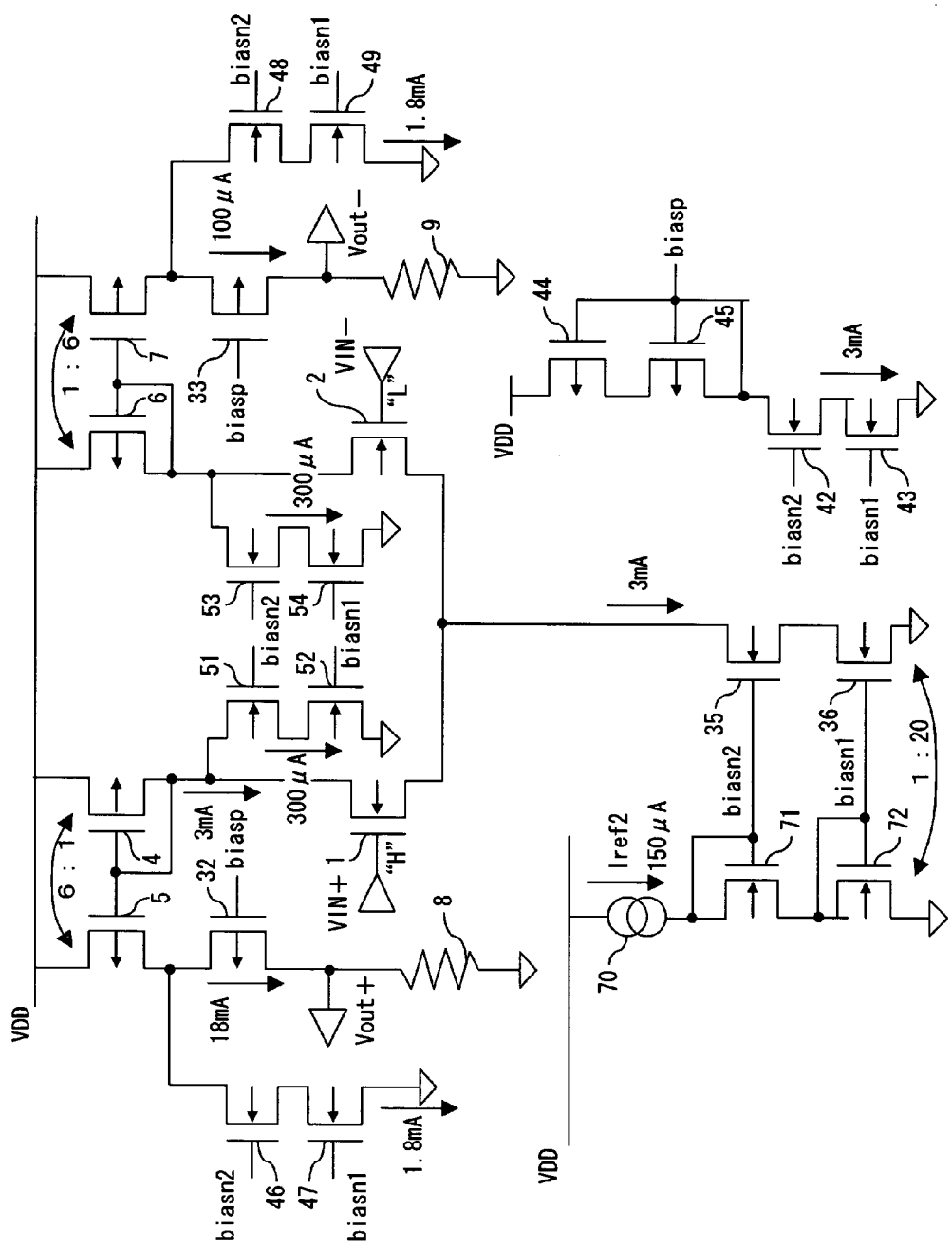
FIG. 15 shows a configuration of the fourth embodiment of the differential amplifier.

FIG. 15 shows the configuration of the fourth embodiment of the differential amplifier using such a cascade current mirror circuit. In this fourth embodiment, the cascade current mirror comprises a reference current 70, the two-stage transistors 71 and 72 monitoring the reference current, and the two-stage transistors 35 and 36 producing the copy current. The circuit which produces four current sources Ia10, Ib11, Ie30, Id31, and bias voltage biasp is the same circuit as that of the first embodiment shown in FIG. 9, and has the same reference numbers and labels as in FIG. 9.

In the cascade current mirror circuit which is used in the fourth embodiment shown in FIG. 15, there is a problem that the lowest limit value of the output voltage of the current source circuit becomes large. In other words, this current mirror circuit comprises four MOSFETs which operate in the saturation region, and it is necessary to add an overdrive voltage as a further voltage to be applied to the gate to make an electric current flow in addition to the threshold voltage Vr between the gate and the source of the MOSFETs which operate in the region of saturation. In the cascade current mirror circuit, the lowest limit value of the output voltage is the value obtained by adding the value of the threshold voltage and the value of two times the overdrive voltage, and the lowest limit value of the output voltage is about 0.9 V.

Figure 16:
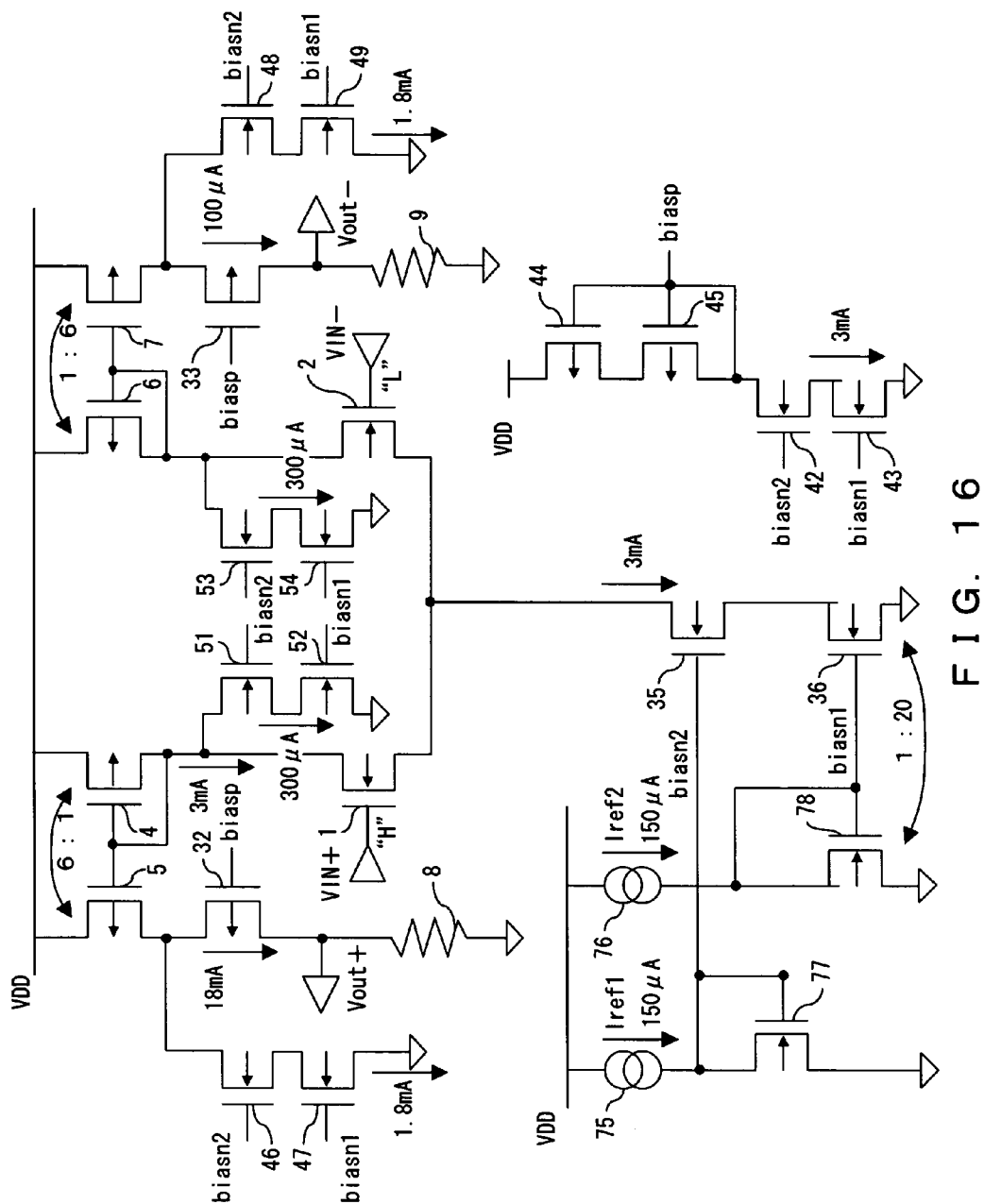
FIG. 16 shows a configuration of a fifth embodiment of the differential amplifier.

FIG. 16 shows the configuration of the fifth embodiment of the differential amplifier using a transformed cascade current mirror which makes the lowest limit value of the output voltage about two times the overdrive voltage. In FIG. 16, the transformed cascade current mirror circuit comprises two reference currents 75 and 76, two transistors 77 and 78 monitoring these reference currents, and two transistors 35 and 36 producing a copy current. The circuit which produces the other four current sources and the bias voltage biasp is the same as that of the first embodiment shown in FIG. 9, and has the same reference numbers and labels as in FIG. 9, which is the same as that of the fourth embodiment shown in FIG. 15.

In the transformed cascade current mirror circuit used in the fifth embodiment, an error occurs because the circuit in which the reference current Iref2 flows inside the circuit monitoring a current is not cascade-connected. The circuit in which this part is cascade-connected to prevent errors is the low-voltage current mirror circuit used in the first embodiment shown in FIG. 9. In the first embodiment and the second embodiment shown in FIG. 10, the differential amplifier comprises the low-voltage current mirror circuit whose performance is high as a current mirror and which can make the lowest limit of the output voltage lower.

In the third to the fifth embodiments, the first embodiment in which various kinds of current mirror circuits are used for two current sources Ia10 and Ib11 as shown in FIG. 6 is described, but it is possible as a matter of course to use various kinds of current mirror circuits in response to the second embodiment shown in FIG. 10.

Further described below are other embodiments of the present invention. In the third to fifth embodiments, embodiments based on the first embodiment shown in FIG. 9 and the second embodiment shown in FIG. 10 were explained, but in the first embodiment and the second embodiment, there is a problem in that there possibly remains some influence of fluctuations in the manufacturing process of semiconductors.

As explained in FIG. 11, for example, in the first embodiment, during a period when VIN+ is L and transistor 1 is off, it is necessary to make an electric current of 1.8 mA corresponding to 300 μA flowing to the transistor 4 constituting the current mirror circuit flow to the transistors 46 and 47 corresponding to the current source Ie30, but the electric current flowing to the transistor 5 constituting the current mirror circuit becomes 1.8 mA+ΔIds according to the manufacturing process of semiconductors, and this current cannot be sufficiently drawn out by the transistors 46 and 47, so there is a possibility that the current of ΔIds flows out from the output terminal as a leakage current.

FIG. 17 shows the influence of the conditions for the semiconductor manufacturing process upon the characteristics of the drain source current Ids against the drain source voltage Vds. In FIG. 17, the saturation of the current Ids is remarkable in the typical (TYP) conditions for the manufacturing process, but the current Ids in the power (POW) conditions in which the operation of transistors becomes fast is not so saturated, and even if efforts are made to fix Ids, for example, at 1.8 mA, the current becomes 1.8 mA+ΔIds according to the value of Vds, thus giving rise to a possibility that this current ΔIds flows out from the output terminal as a leakage current.

Next, in the first embodiment shown in FIG. 9, when VIN+ becomes H, and the voltages at both ends of the resistor 8 are output as Vout+, first, an electric current flows to the transistors 46 and 47, and the electric potential of the node 3 which is the connecting point of the transistor 5 and the transistor 32 rises, and then the voltage Vds between the drain and source of the transistor 32 is determined according to the electric potential, and finally the electric potential of the output Vout+ is determined. However, there is a problem in that the impedance of the constant current source Ie30 which is constituted by the transistors 46 and 47 is high, and it takes time for the electric potential of the node 3 to be determined, thereby causing jitter of the output voltage Vout+ to be produced. Moreover, since the current of the transistors 46 and 47 varied according to the fluctuations of the manufacturing process, the variation of the jitter also became large according to the fluctuations of the manufacturing process.

Figure 18:
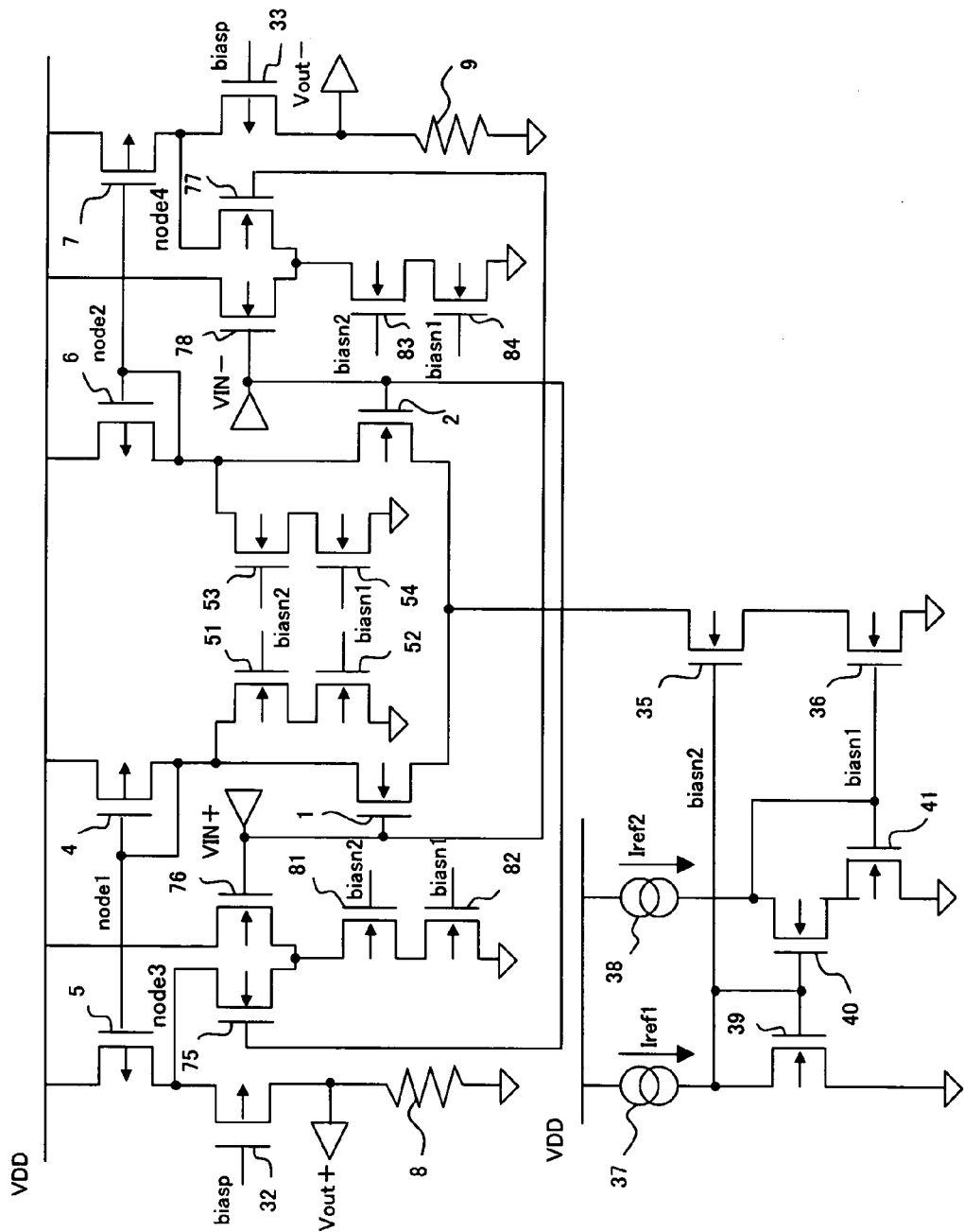
FIG. 18 shows the configuration of a sixth embodiment of the differential amplifier.

FIG. 18 shows the configuration of the differential amplifier in the sixth embodiment of the present invention. When FIG. 18 is compared with FIG. 9 which shows the first embodiment, it is found to be different in that the current source connected to the node 3 and the node 4 is constituted by two transistors 75 and 76 on the side of the node 3, two transistors 81 and 82 corresponding to the current source, two transistors 77 and 78 on the side of the node 4, and two transistors 83 and 84 corresponding to the current source. The first transistor in claim 6 corresponds to the transistor 5 or 7, the second transistor corresponds to the transistor 32 or 33, the third transistor corresponds to the transistor 75 or 77, and the fourth transistor in claim 7 corresponds to the transistor 76 or 78.

For example, when the input signal VIN+ is L, and VIN− is H on the side of the node 3, the transistor 75 turns on and the transistor 76 turns off. Consequently, when the transistor 1 which constitutes the differential pair is off, the current of 1.8 mA flowing to the transistor 5 flows to the transistors 81 and 82 which constitute the current source via the transistor 75 in response to the current flowing to the transistor 4, for example, of 300 μA. By setting the current of the current source for the two transistors 81 and 82 to a value larger than 1.8 mA, for example, 2 mA, even if the current flowing to the transistor 5 becomes larger than 1.8 mA according to the fluctuations of the manufacturing process, said current can be absorbed by the current of the current source constituted by the transistors 81 and 82 without making the leakage current ΔIds flow to the transistor 32.

Bias voltages, biasn2 and biasn1, are supposed to be applied to the transistors 81 and 82 in the same way as for the transistors 46 and 47 shown in FIG. 9, and this is based on the premise that the current of the current source is set to a value different from 1.8 mA, for example, 2 mA according to the size of the transistor, but it is possible as a matter of course to apply, for example, to the transistor 82 the voltage of biasn3 which differs from a bias voltage for the transistor 47 and set the current of the current source to 2 mA.

Figure 19:
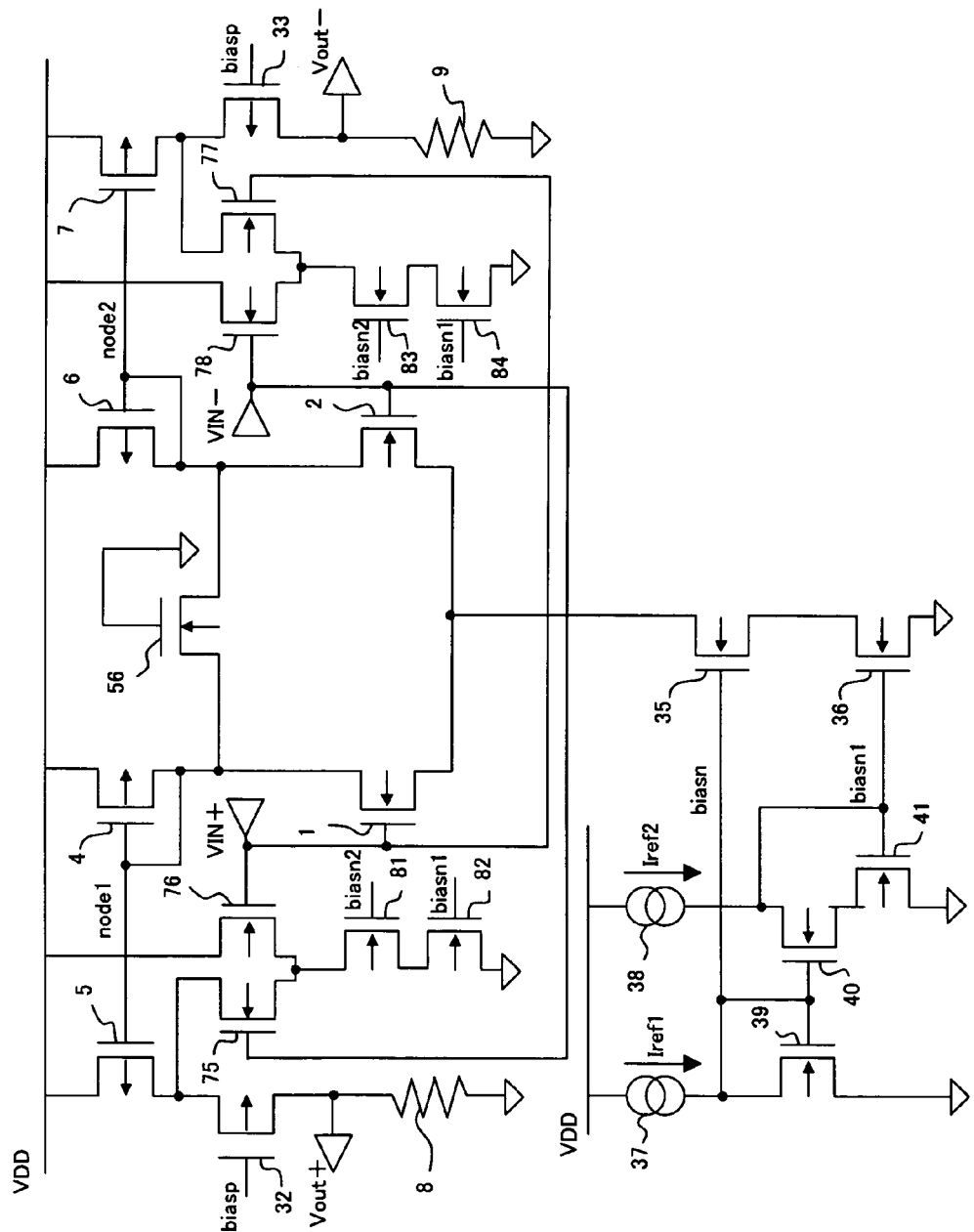
FIG. 19 shows the configuration of a seventh embodiment of the differential amplifier.

FIG. 19 shows the configuration of the seventh embodiment of the differential amplifier. FIG. 19 is a drawing in which the current source connected to the node 3 and the current source connected to the node 4 have been changed in the same way as in FIG. 18 in response to the second embodiment shown in FIG. 10, and since the operation of this embodiment is basically the same as that of the sixth embodiment shown in FIG. 18, detailed descriptions of said operation are omitted.

Figure 20:
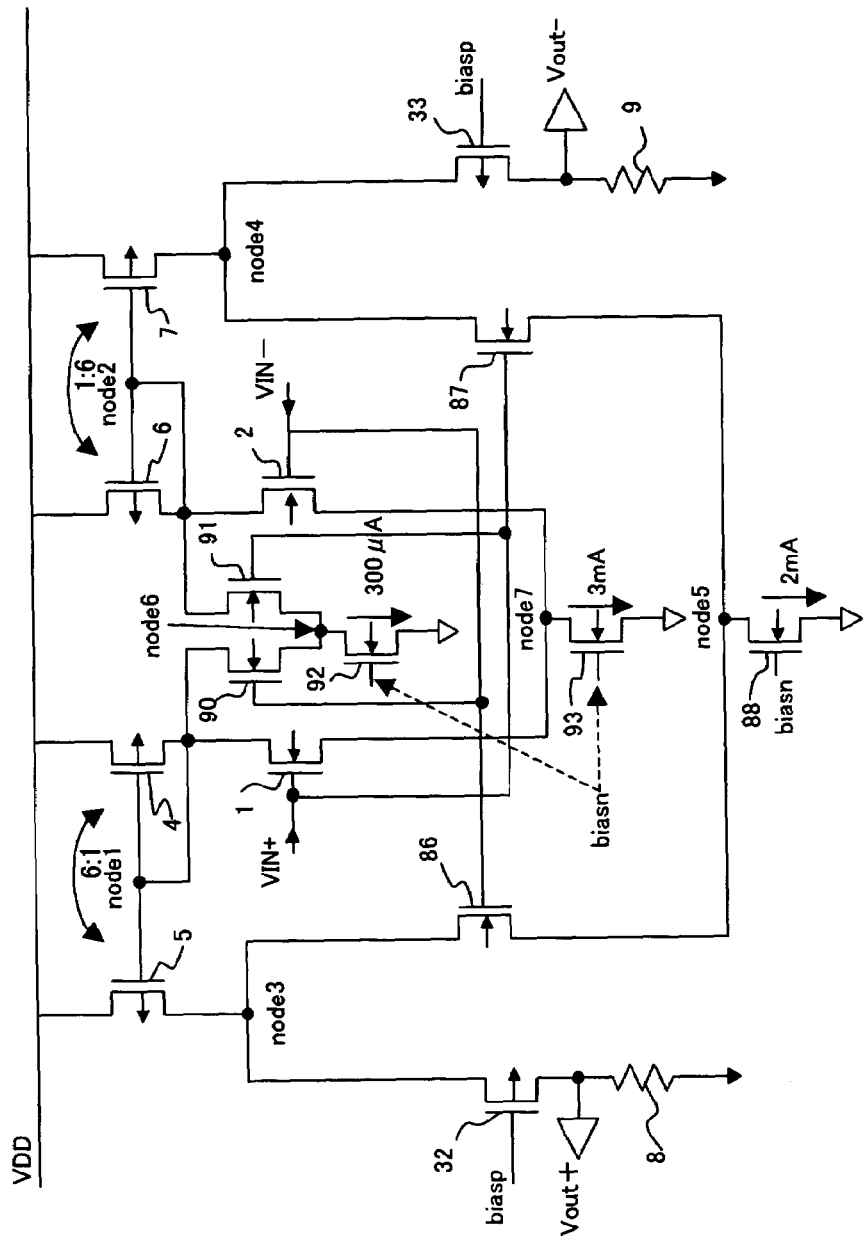
FIG. 20 shows the configuration of an eighth embodiment of the differential amplifier.

FIG. 20 shows the configuration of the eighth embodiment of the differential amplifier of the present invention. Like the sixth and seventh embodiments, in this eighth embodiment, a leakage current from the output terminal due to the fluctuations of the manufacturing process and the variation of the jitter can be prevented, and the increase of power consumption on the grounds that a current of, for example, 300 μA is always flowing to two current sources Ia10 and Ib11 in the basic configuration shown in FIG. 6 can be prevented.

Two current sources Ie30 and Id31 shown in FIG. 6 comprise the transistor 86 connected to the node 3 in FIG. 20, the transistor 87 connected to the node 4, and the transistor 88 as the current source to which these two transistors are connected. When VIN− is H, and VIN+ is L on the side of the node 3, the transistor 86 turns on, and even if the current flowing through the transistor 5 increases above 1.8 mA due to the fluctuations of the manufacturing process, the increase is absorbed by 2 mA flowing to the transistor 88, and a leakage current is prevented from flowing out from the output terminal. At that time, on the side of the node 4, the voltages at both ends of the resistor 9 are output as Vout−, but since the transistor 87 is off, the current flowing to the current source constituted by the transistor 88 does not affect the output current according to the output voltage Vout−. The first transistor in claim 9 corresponds to the transistor 5 or 7, the second transistor corresponds to the transistor 32 or 33, and the third and fourth transistors correspond to the transistors 86 and 87.

The transistors 90 and 91 shown in FIG. 20 and the transistor 92 constituting the current source of 300 μA correspond to two current sources Ia10 and Ib11 shown in FIG. 6. However, the actual current source is only one transistor 92.

When the input signal VIN+ is H, and VIN− is L in FIG. 20, the transistor 90 turns off and the transistor 91 turns on, and the current of 300 μA which should flow to the transistor 6 flows via the transistor 91. On the other hand, when VIN+ is L, and VIN− is H, the transistor 90 turns on, and the transistor 91 turns off, and the current of 300 μA which should flow to the transistor 4 flows via the transistor 90. As a result, the transistor 92 alone is sufficient for the current source, thus causing the power consumption to be reduced. It has been found that the current consumption of about 2.1 mA can be reduced when seeing the current consumption on the side of the power source.

In the sixth to eighth embodiments, it is possible to prevent a leakage current of the output occurring due to the fluctuations of the manufacturing process, and lessen the variation of the jitter, as well as to realize low power consumption in the eighth embodiment. It is also possible as a matter of course to use various kinds of current mirror circuits similar to those in the first to fifth embodiments for transistor 93, etc. constituting the current source of 3 mA in FIG. 20.

Moreover, for example, in the sixth embodiment shown in FIG. 18, it is also possible as a matter of course to use the transistors 90 to 92 corresponding to one current source instead of using the transistors 51 to 54 corresponding to two current sources, and to employ a combination of various embodiments, for example, by changing the configuration using the transistors 75 to 78, and 81 to 84 into the configuration using the transistors 86 to 88.

Figure 21:
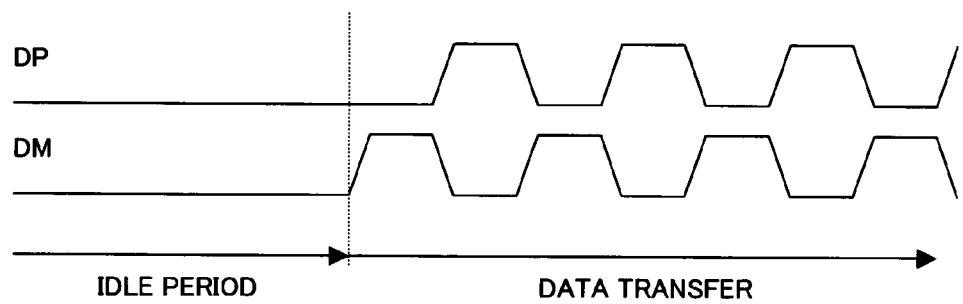
FIG. 21 is a time chart of USB data transfer when transfer starts.

Although, in the foregoing, as explained in FIG. 5 for example, a speed increase of the operation of the differential amplifier when transferring data using USB cables was explained, there are problems which cannot be resolved by the foregoing embodiments at the start of data transfer. FIG. 21 and FIG. 22 are explanatory diagrams of these problems.

FIG. 21 is a time chart of the data transfer at the start of transfer in the USB 2.0 standard high-speed data transfer. In the USB 2.0 standard, a data plus signal DP and a data minus signal DM are transferred as data signals. Although the values of both of these signals are L during the idle period when data transfer is not being performed, when data transfer begins, for example, the DM signal first becomes H, and subsequently periods of L and H are repeated. Correspondingly, the DP signal is transferred as a waveform which is the inverted form of the DM signal. The data plus signal DP corresponds to the input signal VIN+ signal on the differential amplifier side, and the data minus signal DM corresponds to the VIN− signal.

FIG. 22 is an explanatory diagram of an operation delay in the differential amplifier side. The waveforms of input signals VIN+ and VIN− in this diagram are the same as those of the data signals DP and DM in FIG. 21. Because both of the two input signals VIN+ and VIN− are L until the start of data transfer as such, for example, both transistors 4 and 6, through which the monitor current of the current mirror circuit flows in FIG. 20, are cut off, and thus, even when VIN− becomes H at the start of data transfer, the rising edge of the corresponding output Vout− is delayed, for example, by about 100 ps.

Figure 23:
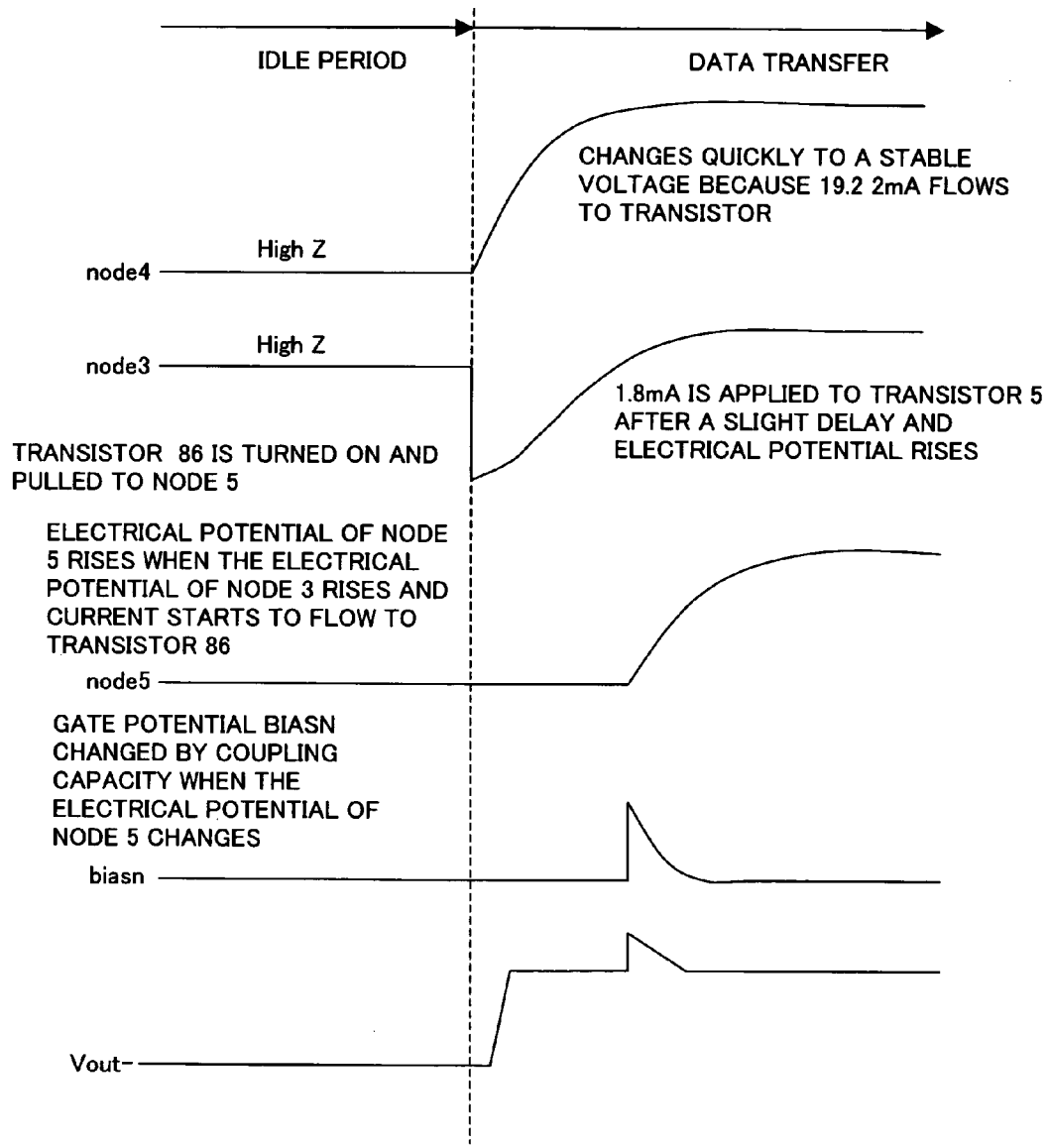
FIG. 23 is an explanatory diagram of output instability in the differential amplifier when data transfer starts.

In addition, in the eighth embodiment, not only is the output voltage at the start of data transfer delayed, but there is also a problem in that the output voltage immediately after the transfer starts is unstable. FIG. 23 is an explanatory diagram of this problem. In other words, in the eighth embodiment the electrical potential of the node 5 at the start of data transfer changes, and as a result, the electrical potential of the gate of the transistor 88, namely bias voltage, changes. If, for example, the same bias voltages are used for both transistors 92 and 93, the current applied to the transistors 88, 92, and 93, constituting the current source, changes and, as a result, the output voltage becomes unstable.

This problem is explained further. In FIG. 20, when input voltages VIN+ and VIN− are both L, transistors 1, 2, 86, 87, 90, and 91 are all turned off, and current does not flow through transistors 88, 92 or 93. On the other hand, bias voltage is applied to transistors 88, 92, and 93, and thus these transistors are turned on, and node 5, node 6, and node 7 all have electrical potentials near 0V. In addition, current does not flow through even transistors 5 and 7 and node 3 and node 4 are in a high-impedance state.

Here, if one of the inputs, for example VIN−, is H at the start of data transfer, the transistors 86, 90, and 2 are turned on. At this time, the electrical potential of node 3 becomes a low value because it is pulled by the electrical potential of node 5, once, due to the transistor 86 turning on.

On the other hand, when the transistor 90 is turned on, a weak current of 300 μA flows through the transistor 4, and as a result, a current of 1.8 mA starts to flow through the transistor 5, the electrical potential of node 3 gradually rises. Current does not flow through the transistor 86 until the electrical potential of the node 3 becomes high and the electrical potential of the node 5 rises when current starts to flow through the transistor 86.

The fluctuation of the electrical potential of the node 5, as such, causes change in the gate potential of the transistor 88, namely the bias voltage biasn, via the coupling capacity between the gate drains of the transistor 88. If the transistors 92 and 93 use the same bias circuit which generates bias voltage biasn, the current values flowing through the transistors 88, 92, and 93 change. As a result, the output voltage Vout− becomes the voltage wherein triangular-form noise is layered over the H level, as shown in the lower-most part of FIG. 23, and becomes a problem at the start of data transfer as the instability of voltage, along with the delay of the rising edge of the output voltage Vout−.

Figure 24:
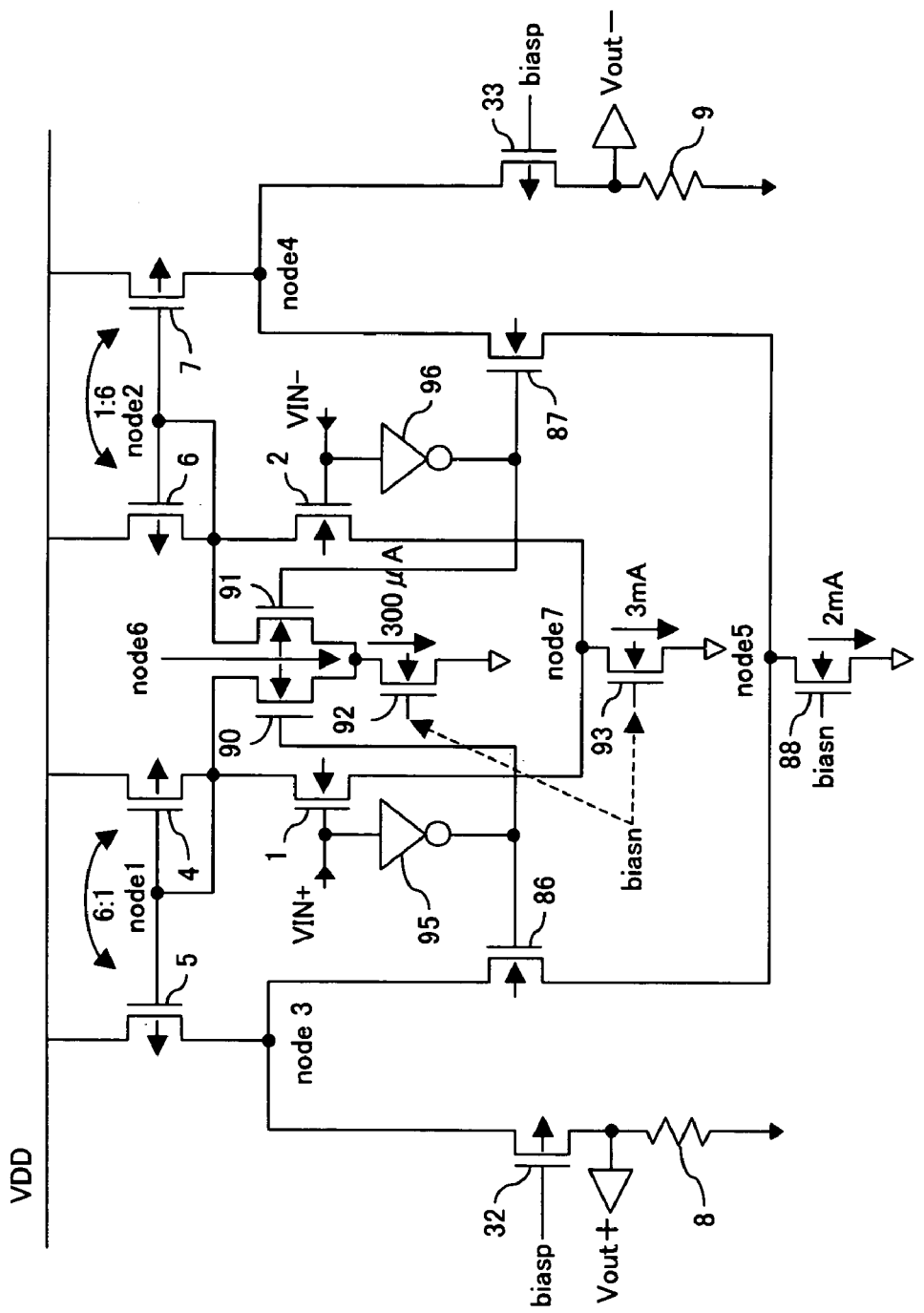
FIG. 24 shows the configuration of a ninth embodiment of the differential amplifier.

FIG. 24 shows the configuration of a ninth embodiment of the differential amplifier. As in the eighth embodiment described in FIG. 20, in this embodiment, operation delays of the differential amplifier at the start of data transfer, described in FIG. 21 and FIG. 22, and instability of the output voltage, described in FIG. 23, can be prevented by reducing power consumption by not applying a weak current which prevents the transistor which comprises the current mirror circuit from being cut off, when the value of the corresponding input is H.

When the configuration of this ninth embodiment is compared to that of the eighth embodiment, it differs in that the output of the inverter 95, for inverting the input signal VIN+, is connected to the gates of the transistors 86 and 90, and additionally, the output of the inverter 96, for inverting the input signal VIN− is connected to the gates of the transistors 87 and 91.

In the ninth embodiment of FIG. 24, the first transistors in the claims 26 and 32 in the patent application of the present invention correspond to the transistors 5 and 7; the second transistors correspond to the transistors 32 and 33; and the third transistors correspond to the transistors 86 and 87.

In this ninth embodiment, when both input signals VIN+ and VIN− are L, all of the transistors 86, 87, 90, and 91 are on, and when VIN+ is H and VIN− is L, transistors 86 and 90 are off and transistors 87 and 91 are on, and when VIN+ is L and VIN− is H, transistors 86 and 90 are on and transistors 87 and 91 are off.

In this way, by turning both transistors 90 and 91 on before the start of data transfer, a weak current for preventing the cut-off of transistors 4 and 6, through which the monitor current of the current mirror circuit flows, is applied thereto and the delay in the operations of the differential amplifier at the start of the data transfer is prevented. At the same time, the transistor of which the corresponding input becomes H, of the two transistors 90 and 91, is turned off after the start of the transfer operation, the current which flows through the transistor 92, constituting the current source, is reduced and power consumption can be reduced, as well.

Furthermore, the problem described in FIG. 23 in this ninth embodiment, namely, the problem in the eighth embodiment in FIG. 18, where the transistors 86 and 87 are off before the start of data transfer, the electrical potential of the node 5 becomes unstable, and the resulting output voltage becomes unstable, can be resolved. In other words, the transistors 86 and 87 are on, even when the input voltages VIN+ and VIN− are both L, the effect on the bias voltage at the start of transfer due to the fluctuation in the electrical potential of the node 5 can be reduced and the instability of the output currents described in FIG. 23, can be prevented.

Figure 25:
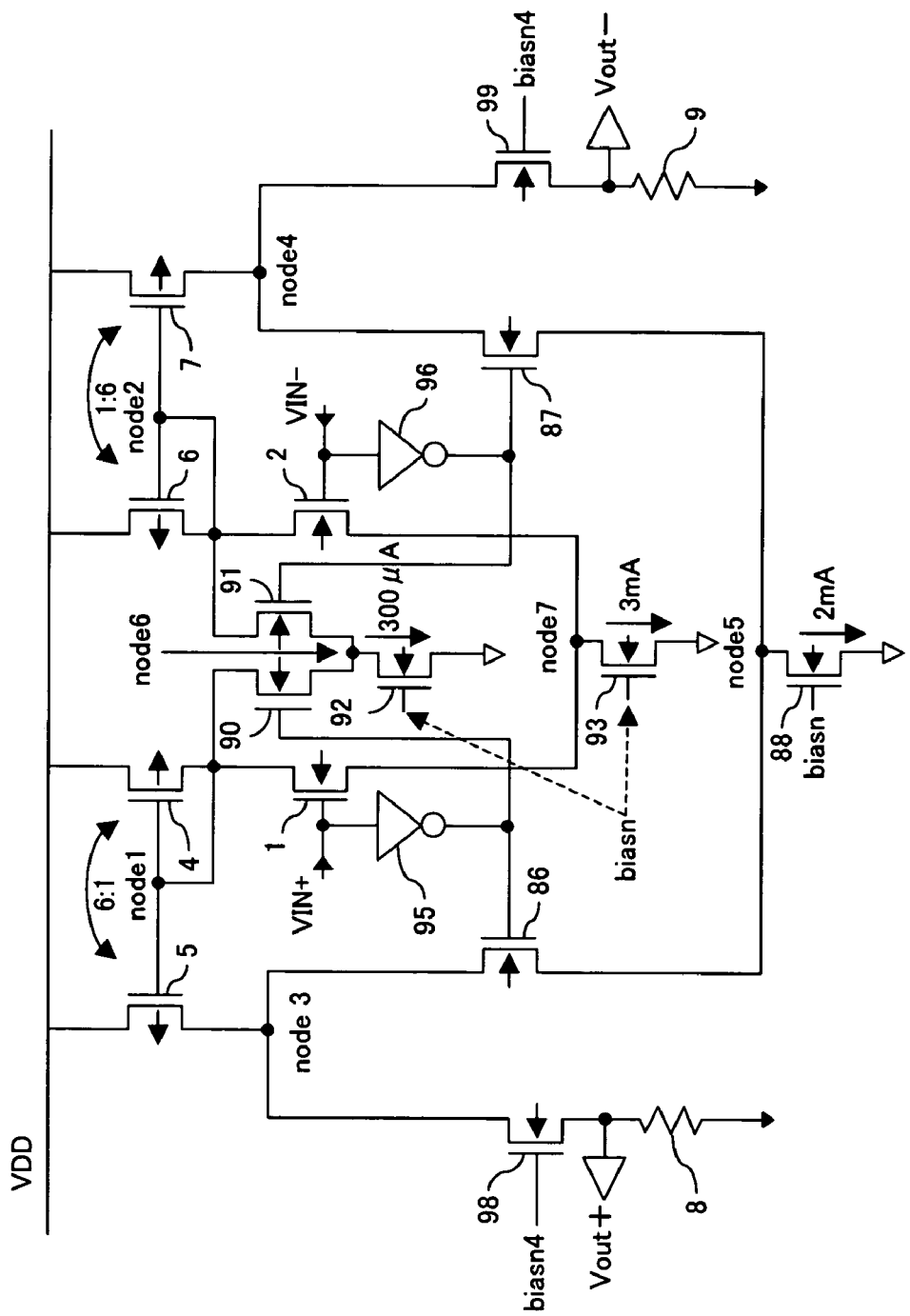
FIG. 25 shows the configuration of a tenth embodiment of the differential amplifier.

FIG. 25 shows the configuration of a tenth embodiment of the differential amplifier. When this configuration is compared with that of the ninth embodiment in FIG. 24, it differs in that n-channel transistors 98 and 99 are used in place of p-channel transistors 32 and 33 and n-channel transistors are used for every transistor excluding the transistors 4 to 7, constituting the current mirror circuit. As are the p-channel transistors 32 and 33, the n-channel transistors 98 and 99 must be off when the corresponding input VIN+ and VIN− are L and bias voltage biasn4, corresponding to such operations, must be provided to the gate.

Although the ninth and tenth embodiments of the present invention are described above, the basic concept behind these ninth and tenth embodiments, namely the concept of applying a weak current to the transistors through which the monitor current of the current mirror circuit flows when both of the two inputs VIN+ and VIN− are L, can be applied, for example, to the first embodiment in FIG. 9, as in numerous other embodiments, by inserting a transistor which is turned on when the input voltages VIN+ and VIN− are both L, between the transistor 51 and the connecting point of transistors 1 and 4 and between the transistor 53 and the connecting point of transistors 2 and 6. In addition, in the ninth and tenth embodiments, the current supplies are respectively composed of one transistor, and although the bias voltages applied to these transistors can be determined in the same way as in the third embodiment in FIG. 14 for example, these current supplies can also be composed respectively of two-stage transistors, as in the first embodiment.

Furthermore, as a circuit for determining the bias voltages applied to the transistors and the like which comprise these current supplies, various current mirror circuits such as a low-voltage current mirror circuit, as in the foregoing, a fundamental current mirror circuit, a cascade current mirror circuit, and a transformed cascade current mirror circuit can be used.

What is claimed is:

1. A differential amplifier, comprising:
   a first and second transistor to which the inputs to the differential amplifier are respectively provided;
   first and second current sources each connected between a ground and each terminal of said first and second transistors which provides the output point of said differential amplifier; and
   first and second current mirror circuits each of which comprises third and fourth transistors and delivers the output of the differential amplifier to the load side by means of an electric current, the third transistor being connected to one of the first and second transistors and to which a monitor current flows in the current mirror circuit, and the fourth transistor to which a copy current flows in the current mirror circuit;
   a fifth transistor being connected between said fourth transistor and a resistor as the load, and to which the output of the differential amplifier is delivered, the fifth transistor being turned off when one of the inputs of the first and second transistors is low (L); and
   a third current source connected between the ground and the connection point of the fourth transistor and the fifth transistor.

2. The differential amplifier according to claim 1, wherein said first, second and third current sources comprise sixth transistors respectively; and
   the sixth transistors and a first bias circuit unit which applies a bias voltage to the
   sixth transistors, constituting third current mirror circuits.

3. The differential amplifier according to claim 2, further comprising:
   a second bias circuit for applying a second bias voltage to the fifth transistor, said second bias circuit comprising at least one stage of a seventh transistor for receiving a first bias voltage from a first bias circuit and two-stage eighth transistors connected between the power source and the seventh transistor for applying a second bias voltage to the fifth transistor so that the fifth transistor turns off when "L" is applied to one of the inputs of the differential amplifier.

4. The differential amplifier according to claim 3, wherein the gate of the two-stage eighth transistors is connected to the connection point of the seventh transistor of one or more stages and the two-stage eighth transistor; and
   the second bias voltage which is supplied to the fifth transistor is determined by adjusting the size of the two-stage eighth transistors and the current which flows to the eighth transistor.

5. The differential amplifier according to claim 2, wherein the current mirror circuits is a cascade current mirror circuit in which the output impedance of the current source is large.

6. The differential amplifier according to claim 2, wherein the current mirror circuit is a transformed cascade current mirror circuit in which the lowest limit of the output voltage of the current source is low.

7. The differential amplifier according to claim 2, wherein the current mirror circuit is a low-voltage mirror circuit which cascade-connects the fourth transistor to which a copy current flows and the third transistor to which a monitor current flows.

8. The differential amplifier according to claim 1, further comprising:
   a current mirror circuit which delivers the output of the differential amplifier to the load side by means of an electric current,
   a first transistor to which one of the inputs is supplied, and which is connected to the transistor to which a monitor current flows in the current mirror circuit, and to which a copy current flows in the current mirror circuit;
   a second transistor which is connected to the resistor as a load to which the output of the differential amplifier is delivered, and which turns off when the input to the transistor to which one of two inputs is supplied is L;
   a third transistor which is connected to the connecting point of the first transistor and second transistor and which turns on when the input to the transistor to which one of the two inputs is provided is L; and
   a current source connected between the third transistor and the grounding wire.

9. The differential amplifier according to claim 8, further comprising:
   a fourth transistor which is connected between the source voltage and the current source connected between the third transistor and the grounding wire, and which turns on when the input to the transistor to which one of the inputs is provided is H.

10. A differential amplifier, comprising:
    a first and second transistor to which the inputs to the differential amplifier are respectively provided;
    a circuit element connected between the terminals of the first and second transistors which provide the output point of the differential amplifier; and
    first and second current mirror circuits each of which comprises third and fourth transistors and delivers the output of the differential amplifier to the load side b means of an electric current, the third transistor being connected to one of the first and second transistors and to which a monitor current flows in the current mirror circuit, and the fourth transistor to which a copy current flows in the current mirror circuit;
    a fifth transistor being connected between the fourth transistor and a resistor as the load, and to which the output of the differential amplifier is delivered, the fifth transistor being turned off when one of the inputs of the first and second transistors is provided, and
    a current source connected between the ground and the connection point of the fourth transistor and the fifth transistor.

11. The differential amplifier according to claim 10, wherein
    the circuit element comprises a transistor which makes a weak current flow, or a resistor.

12. The differential amplifier according to claim 10, wherein
    said current source comprises sixth transistors; and
    the sixth transistors and a first bias circuit unit which applies a bias voltage to the sixth transistors, and constituting third current mirror circuits respectively.

13. The differential amplifier according to claim 12, further comprising:
- a second bias circuit for applying a second bias voltage to the fifth transistor, said second bias circuit comprising at least one stage of a seventh transistor for receiving a first bias voltage of a first bias circuit and two-stage eighth transistors connected between the power source and the seventh transistor for applying a second bias voltage to the fifth transistor so that the fifth transistor turns off when "L" is applied to the circuit of the differential amplifier.

14. The differential amplifier according to claim 13, wherein
- the gate of the two-stage eighth transistors is connected to the connection point of the seventh transistor of one or more stages and the two-stage eighth transistors; and
- the second bias voltage which is supplied to the fifth transistor is determined by adjusting the size of the two-stage eighth transistors and the current which flows to the eighth transistor.

15. The differential amplifier according to claim 12, wherein
- the current mirror circuits is a cascade current mirror circuit in which the output resistance of the current source is large.

16. The differential amplifier according to claim 12, wherein
- the current mirror circuit is a transformed cascade current mirror circuit in which the lowest limit of the output voltage of the current source is low.

17. The differential amplifier according to claim 12, wherein
- the current mirror circuit is a low-voltage mirror circuit which cascade-connects the fourth transistor to which a copy current flows and the third transistor to which a monitor current flows.

18. The differential amplifier according to claim 10, further comprising:
- a current mirror circuit which delivers the output of the differential amplifier to the load side by means of an electric current;
- a first transistor to which one of the inputs is provided, and which is connected to the transistor to which a monitor current flows in the current mirror circuit, and to which a copy current flows in the current mirror circuit;
- a second transistor which is connected to the resistor as a load to which the output of the differential amplifier is delivered, and which turns off when the input to the transistor to which one of two inputs is provided is L;
- a third transistor which is connected to the connecting point of the first transistor and second transistor and which turns on when the input to the transistor to which one of the two inputs is provided is L; and
- a current source connected between the third transistor and the grounding wire.

19. The differential amplifier according to claim 18, further comprising:
- a fourth transistor which is connected between the source voltage and the current source connected between the third transistor and the grounding wire, and which turns on when the input to the transistor to which one of the two inputs is provided is H.

20. A differential amplifier, comprising:
- two transistors that constitute the differential amplifier and that are connected to each terminal which can be the output point for the differential amplifier among the terminals of each transistor to which one of the two inputs for the differential amplifier is provided, and one of which turns off when the other is on, and one of which turns on when the other is off, and
- a current source connected between the two transistors and the grounding wires, and
- a cut-off prevention device that is connected to the connecting point of the transistor to which a monitor current of the current mirror circuit flows to deliver the output of the differential amplifier to the load side and which makes the current flow which does not cut off the transistor to which the monitor current flows even when the input to the transistor to which the input is provided is low (L).

21. The differential amplifier according to claim 20, further comprising:
- a current mirror circuit which delivers two outputs of the differential amplifier to the load side by means of an electric current;
- a first transistor to which one of the inputs is provided, and which is connected to the transistor to which a monitor current flows in the current mirror circuit, and to which a copy current flows in the current mirror circuit;
- a second transistor which is connected to the resistor as a load to which the output of the differential amplifier is delivered, and which turns off when the input to the transistor to which one of the two inputs is provided is L;
- third and fourth transistors which are connected to the connecting point of the first transistor and the second transistor, and one of which turns off when the other is on, and one of which turns on when the other is off; and
- a current source connected between the third and fourth transistors and the grounding wires.

22. A differential amplifier, comprising:
- a transistor which constitutes the differential amplifier and to which one of two inputs to the differential amplifier is provided; and
- a cut-off prevention device which is connected to the connecting point of the transistor to which a monitor current of the current mirror circuit flows to deliver the output of the differential amplifier to the load side and which makes the current flow which does not cut off the transistor to which the monitor current flows even when the input to the transistor to which the input is provided is L.

23. A differential amplifier, comprising:
- two transistors, which are respectively connected to terminals that are output points of the differential amplifier, out of the terminals of each transistor to which one of two inputs to the differential amplifier is provided, where both of them constitute the differential amplifier, wherein the two transistors are turned on when the input applied to the connected transistor which has a terminal which can be the output point of the differential amplifier is low (L) and turned off when the input is high (H); and further comprising: a current source which is connected between the two transistors and the grounding wires.

24. The differential amplifier according to claim 23, further comprising:
- current mirror circuits each of which delivers the corresponding output to respective outputs of the differential amplifier to the load side by means of an electric current; wherein
- the transistor to which one of the inputs is provided is connected to the transistor to which a monitor current flows in the current mirror circuit, and further comprising:

first transistors to each of which a copy current of the current mirror circuit flows;

second transistors where each of which is connected between the resistor as a load to which said output of the differential amplifier is delivered and one of the first transistors, and which turns off when the input to the transistor to which one of said two inputs is provided is low (L);

third transistors each of which is connected to the connecting point of one of the first transistors and one of the second transistors and which turns on when the input applied to the transistor to which one of the two inputs is provided is low (L); and a current source which is connected between the third transistors and grounding wire.

25. The differential amplifier according to claim 24, wherein:

the current source connected between said two transistors where two inputs of the differential amplifier are provided and grounding wire, and the current source connected between said third transistors and grounding wire are respectively composed of transistors; and said transistors and a bias circuit unit for providing bias voltage to said transistors further constitute current mirror circuits respectively.

26. The differential amplifier according to claim 25, wherein:

said current mirror circuit is a cascade current mirror circuit in which the output resistance of the current source is large.

27. The differential amplifier according to claim 24, wherein:

said current mirror circuit is a transformed cascade current mirror circuit in which the lowest limit of the output voltage of the current source is low.

28. The differential amplifier according to claim 25, wherein:

said current mirror circuit is a low-voltage mirror circuit which cascade-connects a transistor to which a copy current flows and a transistor to which a reference current flows, employing two reference currents, respectively.

29. The differential amplifier according to claim 23, wherein:

the input is provided to the gates of each transistor and an inverter is connected between the gates of the two transistors and the gates of each transistor.

30. The differential amplifier according to claim 29, further comprising:

current mirror circuits each of which delivers the corresponding output to respective outputs of the differential amplifier to the load side by means of an electric current, wherein the transistor to which one of the inputs is provided is connected to the transistor to which a monitor current flows in the current mirror circuit, and further comprising:

first transistors to each of which a copy current of the current mirror circuit flows;

second transistors each of which is connected between the resistor as a load to which the output of the differential amplifier is delivered and one of the first transistors, and which turns off when the input to the transistor to which one of the two inputs is provided is low (L);

third transistors each of which is connected to the connecting point of one of the first transistors and one of the second transistors and which turns on when the input applied to the transistor to which one of the two inputs is provided is low (L); and a current source which is connected between the third transistors and a grounding wire.

31. The differential amplifier according to claim 30, wherein:

the current source connected between said two transistors where two inputs of the differential amplifier are provided and a grounding wire, and the current source connected between said third transistors and a grounding wire are respectively composed of transistors; and said transistors and a bias circuit unit for providing bias voltage to said transistors further constitute current mirror circuits respectively.

32. The differential amplifier according to claim 31, wherein:

said current mirror circuit is a cascade current mirror circuit in which the output resistance of the current source is large.

33. The differential amplifier according to claim 31, wherein:

said current mirror circuit is a transformed cascade current mirror circuit in which the lowest limit of the output voltage of the current source is low.

34. The differential amplifier according to claim 31, wherein:

said current mirror circuit is a low-voltage mirror circuit which cascade-connects a transistor to which a copy current flows and a transistor to which a reference current flows, employing two reference currents, respectively.

35. A differential amplifier comprising:

transistors both of which constitute said differential amplifier and to each of which one of two inputs to said differential amplifier is provided, respectively;

current mirror circuits each of which delivers one of the outputs of the differential amplifier to the load side; and cut-off prevention units each of which is connected to the connecting point of a transistor to which a monitor current of one of the current mirror circuits flows, and one of the transistors to which the inputs are provided, and apply a current to prevent cutting off the transistor to which the monitor current flows, only when the input to the transistor to which the input is provided is L.

* * * * *